(12) United States Patent
Kajigaya

(10) Patent No.: US 7,697,358 B2
(45) Date of Patent: *Apr. 13, 2010

(54) SEMICONDUCTOR MEMORY DEVICE

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 41 days.

This patent is subject to a terminal disclaimer.

(21) Appl. No.: 12/101,347

(22) Filed: Apr. 11, 2008

(65) Prior Publication Data

US 2008/0253159 A1    Oct. 16, 2008

(30) Foreign Application Priority Data

Apr. 11, 2007    (JP)    ............................. 2007-104348

(51) Int. Cl.
 G11C 7/02    (2006.01)
(52) U.S. Cl. ...................................... 365/207; 365/205
(58) Field of Classification Search ................. 365/207, 365/205, 189.04, 185.13
See application file for complete search history.

(56) References Cited

U.S. PATENT DOCUMENTS

| 5,561,626 A | 10/1996 | Fujii |
| 6,452,851 B1 * | 9/2002 | Endo et al. ................... 365/205 |
| 6,646,954 B2 * | 11/2003 | Winograd et al. ...... 365/233.14 |
| 6,937,535 B2 * | 8/2005 | Ahn et al. .................... 365/222 |
| 7,200,061 B2 * | 4/2007 | Sekiguchi et al. ........... 365/207 |

FOREIGN PATENT DOCUMENTS

| JP | 10-512085 | 11/1998 |
| JP | 2000-57761 | 2/2000 |
| JP | 3521979 | 2/2004 |
| JP | 3529534 | 3/2004 |
| WO | WO 96/31882 | 10/1996 |

* cited by examiner

*Primary Examiner*—Anh Phung
(74) *Attorney, Agent, or Firm*—Young & Thompson

(57) ABSTRACT

A semiconductor memory device comprises word lines, global bit lines intersecting with the word lines; local bit lines partitioned into N sections along the global bit lines and aligned with a same pitch as the global bit lines; N memory cell arrays each including memory cells formed at intersections of the word lines and the local bit lines and being arranged corresponding to the sections of the local bit lines; local sense amplifiers for amplifying a signal read out from a selected memory cell to the local bit line and for outputting the signal to the global bit line; global sense amplifiers for amplifying the signal transmitted from the local sense amplifier corresponding to the selected memory cell through the global bit line and for selectively coupling the signal to an external data line.

18 Claims, 34 Drawing Sheets

SEMICONDUCTOR MEMORY DEVICE

BACKGROUND OF THE INVENTION

1. Field of the Invention

The present invention relates to a semiconductor memory device which rewritably stores data in a plurality of memory cells formed at intersections of a plurality of word lines and a plurality of bit lines, and particularly relates to a semiconductor memory device in which a memory cell array having a hierarchical structure is configured with a unit including a predetermined number of local bit lines and one global bit line.

2. Description of the Related Art

In a general DRAM, there are provided a memory cell array including memory cells formed at intersections of bit lines and word lines, and a large number of sense amplifiers for amplifying data of the memory cells. In recent years, as the capacity of the DRAM becomes large, an extremely large number of memory cells are connected to each bit line, thereby causing performance problems due to an increase in parasitic capacitance and resistance of the bit line. Further, a configuration in which a large number of memory cells can be arranged in an extremely small area is desired. Under such a back ground, various configurations in which a memory cell array including a hierarchical structure of global bit lines and local bit lines partitioned into sections are proposed (e.g., see Patent References 1 to 4). By employing the memory cell array having such a hierarchical structures the memory cells can be arranged on the local bit line whose length is shorter than that of the global bit line, and a configuration advantageous for reducing parasitic capacitance and resistance can be achieved.

Patent Reference 1: Japanese Patent No. 3521979

Patent Reference 2: Japanese Patent No. 3529534

Patent Reference 3: Published Japanese Translation No. H10-512085

Patent Reference 4: Patent Application Laid-open No. 2000-57761

In order to obtain the advantage of employing the local bit lines, it is desirable to use single-ended sense amplifiers instead of using differential sense amplifiers. Since the single-ended configuration reduces the circuit scale relative to the differential configuration, an increase in the entire area can be suppressed even when sections to which the local bit lines are partitioned are increased.

However, among the above configurations for the hierarchical memory cell array, Patent References 1 to 3 disclose that the sense amplifiers are not directly connected to the local bit lines while connected to the global bit line. As described above, when employing the single-ended sense amplifiers, it is difficult to amplify a minute potential difference, as different from using the differential sense amplifiers. On the other hand, in the configuration where a signal reaches the sense amplifier via both the local bit line and the global bit line, the length of the bit line becomes long and it becomes a problem that operating performance deteriorates due to the influence of the parasitic capacitance and resistance. Meanwhile, in the Patent Reference 4, there is disclosed a configuration in which sense amplifiers connected to local bit lines of a folded bit line structure. However, since memory cells are arranged only at half of intersections of word lines and local bit lines, it is difficult to improve the integration of the memory cell array. Further, this configuration requires the differential sense amplifier connected to a complementary pair of local bit lines, and thus the required area is increased.

BRIEF SUMMARY OF THE INVENTION

An object of the present invention is to provide a semiconductor memory device in which a hierarchical memory cell array is configured for higher integration of the memory cell array connected to local bit lines, and by employing single-ended sense amplifiers connected to the local bit lines, the semiconductor memory device of the present invention can have excellent operating performance and is advantageous for higher integration so that chip area can be suppressed.

An aspect of the present invention is a semiconductor memory device comprising: a plurality of word lines; a plurality of global bit lines intersecting with said plurality of word lines; a plurality of local bit lines partitioned into N (N is an integer greater than or equal to two) sections along said global bit lines and aligned with a same pitch as said plurality of global bit lines; N memory cell arrays each including a plurality of memory cells formed at intersections of said plurality of word lines and said plurality of local bit lines and being arranged corresponding to the sections of said local bit lines; a plurality of local sense amplifiers for amplifying a signal read out from a selected memory cell to said local bit line and for outputting the signal to said global bit line; a plurality of global sense amplifiers for amplifying the signal transmitted from said local sense amplifier corresponding to the selected memory cell through said global bit line and for selectively coupling the signal to an external data line.

According to the semiconductor memory device of the present invention, in a hierarchical memory cell array, the local bit lines each partitioned into N sections along the global bit line are arranged, a signal read out from a memory cell formed at an intersection of a word line and a bit line is amplified by the local sense amplifier through the local bit line, and the signal is further transmitted to the global bit line so as to be coupled to the external data line. Thus, the length of the local bit lines is shortened so that the memory cells of which parasitic capacitance or resistance are suppressed can be arranged with high density, and the circuit configuration can be simple by employing the single-ended local sense amplifiers and the like, thereby an increase in the entire area can be suppressed. Data having sufficient signal level is transmitted through in the connection order of the local bit line, the local sense amplifier, the global bit line, the global sense amplifier, thereby achieving faster access speed and excellent operating margin.

In the present invention, said local sense amplifiers may be single-ended sense amplifiers arranged so that a pitch thereof in a word line extending direction is twice the pitch of said local bit lines. In this case, said local sense amplifiers may be arranged on both sides of said memory cell array, and said local bit lines may be alternately connected to said local sense amplifiers on one side and the other side of said memory cell array.

Thereby, single-ended configuration with a smaller circuit scale than differential configuration is employed for the local sense amplifiers, and the pitch thereof can be twice the pitch of the local bit lines. Therefore, the size of the memory cell can be easily reduced to, for example, 6F2 (F means a design rule) or 4F2 smaller than general 8F2.

In the present invention, two adjacent said memory cell arrays may share said local sense amplifier. In this case, said local sense amplifier may include a switching circuit for switching connections to said local bit lines of said two adjacent memory cell arrays.

In the present invention, said local sense amplifier may include an amplifying NMOS transistor which amplifies the signal read out to said local bit line and outputs the signal to said global bit line. Further, said local sense amplifier may include a precharging NMOS transistor which is connected to a gate of said amplifying NMOS transistor at one end and has a gate to which a precharge signal is applied. Moreover, said local sense amplifier may include an inverting circuit which inverts a signal of said global bit line after the signal read out to said local bit line is amplified so as to be rewritten to the memory cell. In this case, said inverting circuit may include a PMOS transistor connected between a drive control line and said local bit line, and an NMOS transistor connected between the other end of said precharging NMOS transistor and a ground potential.

In the present invention, said local sense amplifier may include only NMOS transistors. In this case, said local sense amplifier may include an NMOS transistor which is connected between said local bit line and the gate of said amplifying NMOS transistor and has a gate to which a first control signal is applied, and includes an NMOS transistor which is connected between said global bit line and said local bit line and has a gate to which a second control signal is applied. Further, said local sense amplifier may include an NMOS transistor which is connected between said global bit line and one end of said amplifying NMOS transistor and has a gate to which a first control signal is applied, and includes an NMOS transistor which is connected between said global bit line and said local bit line and has a gate to which a second control signal is applied.

In the present invention, said global sense amplifiers may be single-ended sense amplifiers arranged so that a pitch thereof in a word line extending direction is twice the pitch of said global bit lines and said local bit lines. In this case, said global sense amplifiers may be arranged at both ends of said N memory cell arrays, and said global bit lines are alternately connected to said global sense amplifiers at one end and the other end of said memory cell arrays.

In the present invention, a plurality of global arrays each including said plurality of global bit lines may be arranged, and two of said plurality of global arrays adjacent to each other in an extending direction of said global bit lines may share said global sense amplifier. In this case, a switching circuit for switching connections between said global arrays and said global sense amplifiers may be provided.

In the present invention, each of said global sense amplifiers may selectively output read data of the memory cell, which is transmitted through said global bit line, to a read data line. Further, each of said global sense amplifiers may selectively output data input from a write data line to said global bit line as write data for the memory cell.

As described above, according to the present invention, by employing a hierarchical memory cell array, the local bit lines each partitioned into N sections along the global bit line are arranged, and the entire semiconductor memory device is configured using the single-ended local sense amplifiers corresponding to the local bit lines and using the single-ended global sense amplifiers corresponding to the global bit lines. Thus, memory cells can be arranged at all intersections of local bit lines having a shortened length intersecting with word lines, and an increase in the entire area can be suppressed using single-ended local sense amplifiers with a simpler configuration than differential sense amplifiers. Thereby, when the size of the memory cell is reduced using a design rule such as 6F2 or 4F2, parasitic capacitance and resistance of the local bit line can be suppressed so as to obtain an adequate signal level, and it is possible to achieve an improvement of the operating margin and a faster access time.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

Preferred embodiments of the present invention will be described with reference to the accompanying drawings. In the following, seven embodiments having different hierarchical structures or different circuit configurations will be described, each as an example where the present invention is applied to a DRAM as a semiconductor memory device.

First Embodiment

Figure 1:
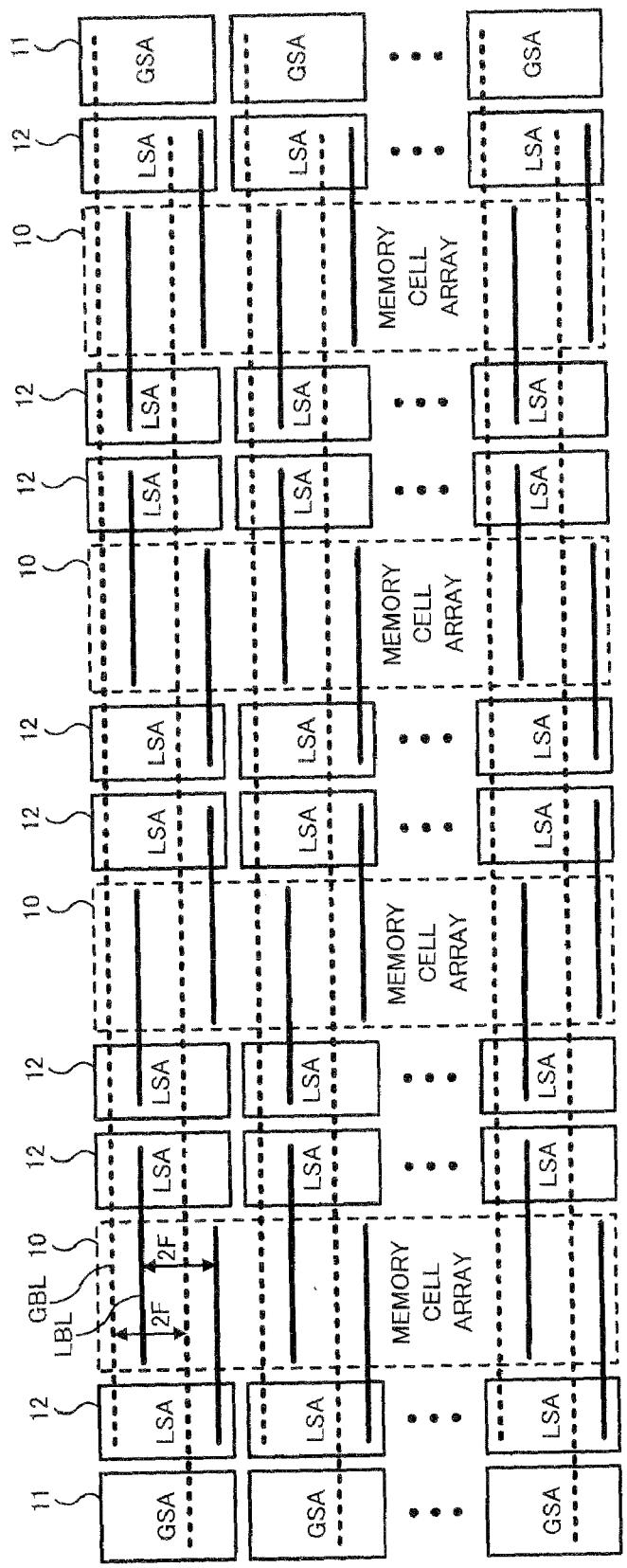
FIG. 1 is an entire configuration of a DRAM of a first embodiment.

A first embodiment of the present invention will be described. FIG. 1 shows an entire configuration of a DRAM of the first embodiment. In FIG. 1, there are shown four memory cell arrays 10, a plurality of global sense amplifiers 11, a plurality of local sense amplifiers 12, a plurality of global bit lines GBL, and a plurality of local bit lines LBL.

Each memory cell array 10 includes a large number of memory cells (not shown) formed at all intersections of a plurality of word lines (not shown) and a plurality of local bit lines LBL intersecting therewith. For example, by arranging M word lines WL and N local bit lines LBL in one memory cell array 10, the memory cell array 10 becomes capable of storing M×N bit data and the entire storage capacity of the DRAM is 4×M×N bits. As shown in FIG. 1, the plurality of local bit lines LBL is regularly aligned with a pitch 2F based on a design rule value F in a word line extending direction. Besides, the plurality of global bit lines GBL is also aligned with the same pitch 2F as the local bit lines LBL.

The local sense amplifiers 12 are arranged on both sides of the memory cell arrays 10, and each local sense amplifier 12 amplifies a signal read from a memory cell through a predetermined local bit line LBL. As shown in FIG. 1, one of two local bit lines LBL adjacent in the word line extending direction in the memory cell array 10 is connected to the left-side local sense amplifier 12, while the other thereof is connected to the right-side local sense amplifier 12. In this case, since each local bit line LBL is partitioned into sections corresponding to the arrangement of the memory cell array 10, each local sense amplifier 12 depends only on one memory cell array 10. Besides, the local sense amplifiers 12 are aligned with a pitch 4F in the word line extending direction.

On the contrary, the global sense amplifiers 11 are arranged at both ends of the four memory cell arrays 10, and each global sense amplifier further amplifies data transmitted from the local sense amplifier 12 to the global bit line GBL. As shown in FIG. 1, each global bit line GBL is arranged extending over all the four memory cell arrays 10. Thus, each global bit line GBL is connected to predetermined four local sense amplifiers 12 among eight local sense amplifiers 12 arranged in a line in a bit line extending direction. Further, one of two global bit lines GBL adjacent in the memory cell array 10 is connected to the left-side global sense amplifier 11, while the other thereof is connected to the right-side global sense amplifier 11. Besides, the global sense amplifiers 11 are also aligned with the pitch 4F in the word line extending direction.

When N local bit lines LBL are arranged in one memory cell array 10, N/2 local sense amplifiers 12 connected to N/2 local bit lines LBL are arranged on each of both sides of the memory cell array 10. In the entire four memory cell arrays 10, 4N local sense amplifiers 12 in total are arranged in eight rows, and N global sense amplifiers 11 in total are arranged in two rows (at both ends).

In this manner, since the memory cell array 10 is configured hierarchically, an increase in the number of memory cells connected to one local bit line LBL can be suppressed. When four of the above memory cell arrays 10 of M×N bits are arranged in parallel, data of 4M memory cells can be transmitted selectively through the global bit line GBL, but M memory cells connected to the local bit line LBL are only required. As the number of memory cells connected to the local bit line LBL is reduced, the parasitic capacitance and resistance of the local bit line LBL are reduced and it has advantages for increasing the signal level and improving the access time.

Figure 2:
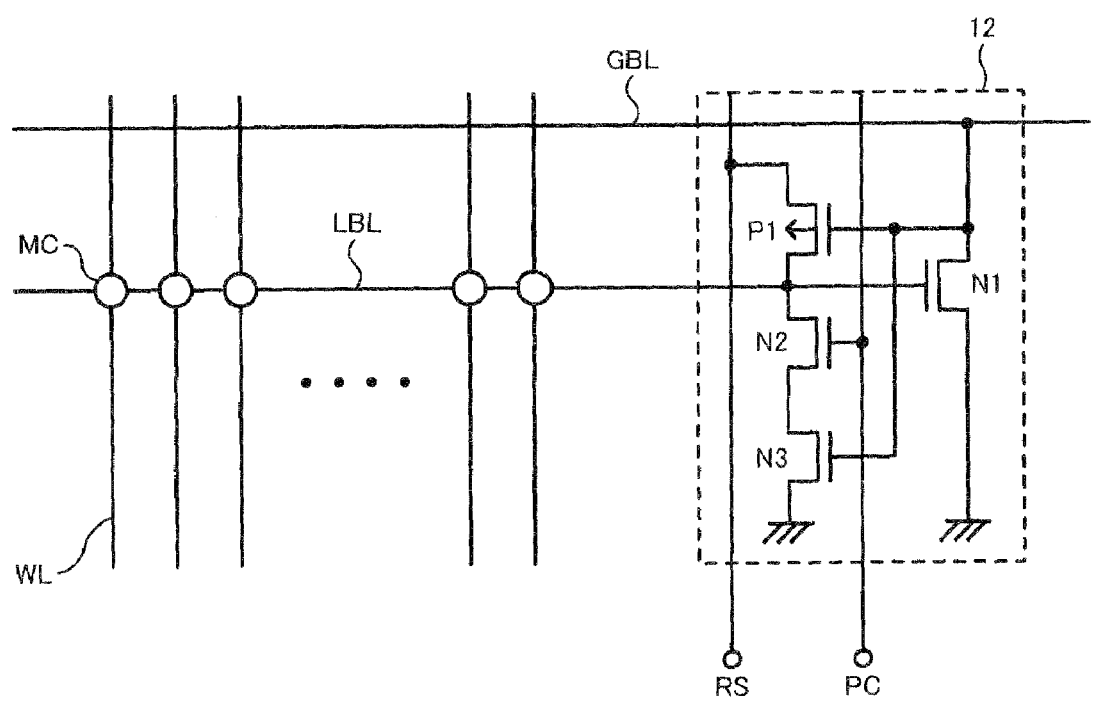
FIG. 2 is a diagram showing a configuration example of a local sense amplifier of the first embodiment.

A configuration example of the local sense amplifier 12 of FIG. 1 will be described with reference to FIG. 2. In FIG. 2, there are shown one local bit line LBL, one global bit line GBL and a local sense amplifier 12 which is arranged on the right side of the memory cell array 10. Memory cells MC on the local bit line LBL are formed at all intersections of a plurality of word line WL (for example, 32 word lines WL) intersecting therewith, and one end of each memory cell MC is connected to the local sense amplifier 12.

The local sense amplifier 12 of FIG. 2 is a single-ended sense amplifier, which includes one PMOS transistor P1 and three NMOS transistor N1, N2 and N3. The NMOS transistor N1 is connected between the global bit line GBL and ground, while the PMOS transistor P1 and the NMOS transistors N2 and N3 are connected in series between a drive control line RS and ground. The local bit line LBL is connected to an intermediate node of the PMOS transistor P1 and the NMOS transistor N2, and also connected to the gate of the NMOS transistor N1. The global bit line GBL is connected to gates of the PMOS transistor P1 and the NMOS transistor N3, in addition to one end of the NMOS transistor N1. Moreover, a precharge signal line PC is connected to the gate of the NMOS transistor N2.

In a precharge operation of the local sense amplifier 12, the precharge signal line PC goes high and the local bit line LBL is precharged to a ground potential VSS. In addition, the global bit line GBL is precharged to a power supply voltage VDL. In an amplifying operation of the local sense amplifier 12, the drive control line RS is controlled to be high and the precharge signal line PC is controlled to be low. In this state, when the selected word line WL is driven, a signal read from an arbitrary memory cell MC is input to the gate of the NMOS transistor N1 through the local bit line LBL.

In a read operation, when a high level is read out to the local bit line LBL, the NMOS transistor N1 turns on and the global bit line GBL goes low. At this point, this is fed back to the gates of the PMOS transistor P1 and the NMOS transistor N3, which form an inverting circuit, and the voltage of the local bit line LBL increases. On the contrary, when a low level is read out to the local bit line LBL, the NMOS transistor N1 turns off and the global bit line GBL goes high. At this point, the voltage of the local bit line LBL decreases by the feed back of the inverting circuit. In this manner, a minute potential of the memory cell MC read through the local bit line LBL is amplified by the local sense amplifier 12, and an inverted signal thereof is output to the global bit line GBL.

Here, operating conditions for the NMOS transistor N1 will be obtained. In FIG. 1, for example, cell capacitance Cs=10 fF and bit line capacitance Cb=4 fF are assumed (capacitance of one memory cell MC on the local bit line LBL is 0.1 fF and 32 word lines WL are arranged; capacitance of one local sense amplifier 12 is 0.8 fF). When the bit line amplitude VDL=1V, high level Vs(H) and low level Vs(L) of the NMOS transistor N1 are calculated in the following manner.

$$Vs(H)=10/(10+4) \times 1 - Vn(H) = 0.71 - Vn(H)$$

$$Vs(L) = 0 + Vn(L)$$

Herein, Vn(H) and Vn(L) are noise components due to leak of charge of memory cell capacitance or due to an influence of coupling with the adjacent local bit line LBL or word line WL. Accordingly, a set range Vt(N) of a threshold voltage of the NMOS transistor N1 needs to be set within a following range.

$$Vs(L) < Vt(N) < Vs(H)$$

Figure 3:
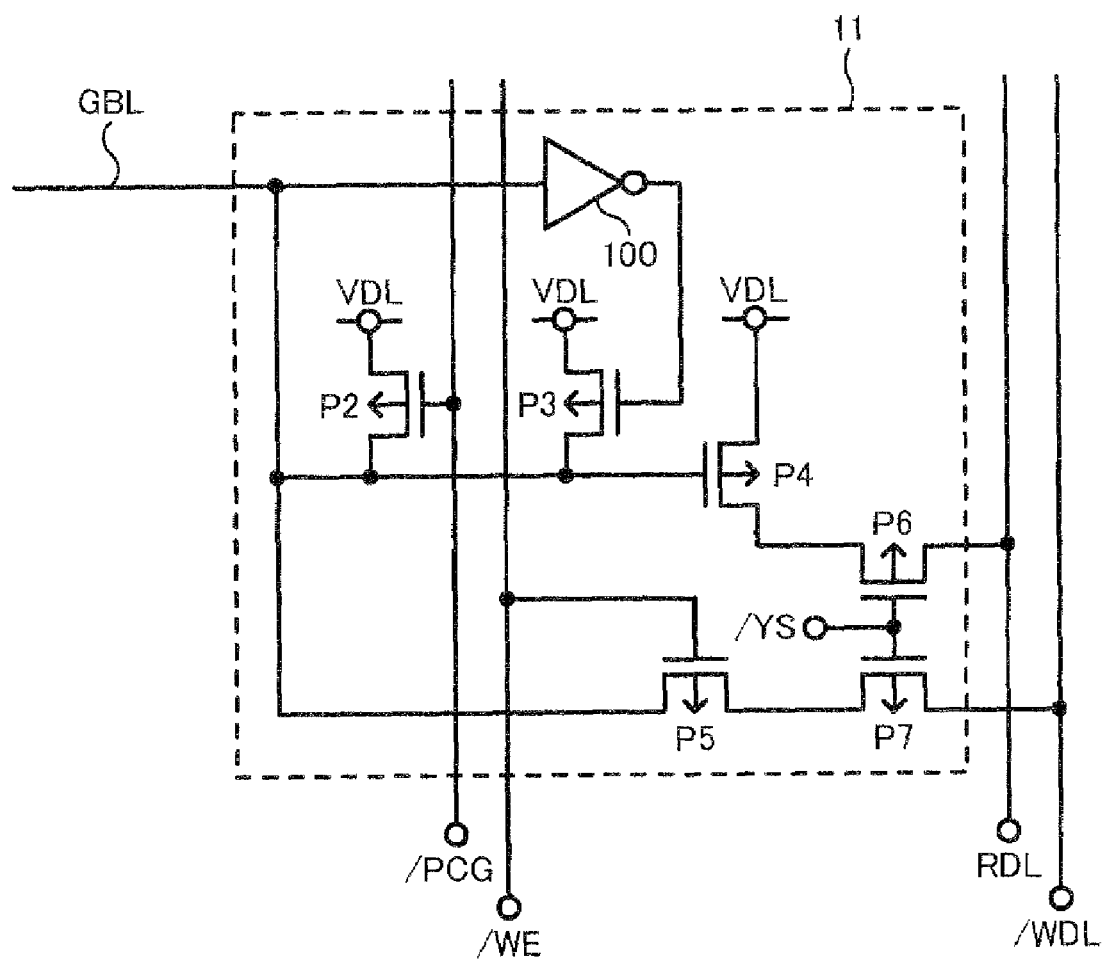
FIG. 3 is a diagram showing a configuration example of a global sense amplifier of the first embodiment.

A configuration example of the global sense amplifier 11 of FIG. 1 will be described with reference to FIG. 3. In FIG. 3, there are shown one global bit line GBL and a global sense amplifier 11 which is arranged at the right end in FIG. 1. The global sense amplifier 11 of FIG. 3 includes six PMOS transistors P2, P3, P4, P5, P6, P7 and one inverter 100.

Here, a symbol / attached to each signal name in FIG. 3 means negative logic. In the following, signals of the negative logic will be represented with the symbol /, except some signal names (for example, global bit line GBL and word line WL).

The PMOS transistors P2 and P3 are connected in parallel between the power supply voltage VDL and the global bit line GBL, and a precharge signal line /PCG is connected to the gate of the PMOS transistor P2. Meanwhile, an inverted signal of the global bit line GBL is applied to the gate of the PMOS transistor P3 via the inverter 100. The PMOS transistors P4 and P6 are connected in series between the power supply voltage VDL and a read data line RDL, and the gate of the PMOS transistor P4 is connected to the global bit line GBL. Meanwhile, a select signal line /YS is connected to the gate of the PMOS transistor P6. The PMOS transistors P5 and P7 are connected between the global bit line GBL and a write data line /WDL, and a control signal line /WE is connected to the gate of the PMOS transistor P5. Meanwhile, the select signal line /YS is connected to the gate of PMOS transistor P7.

As described above, in the precharge operation of the global sense amplifier 11, the precharge signal line /PCG goes low and the PMOS transistor P2 turns on, so that the global bit line GBL is precharged to the level of the power supply voltage VDL. In a read or write operation of an arbitrary local sense amplifier 12 connected to the global bit line GBL, the select signal line /YS is controlled to be low. In the read operation, data of the global bit line GBL is inverted through the PMOS transistors P4 and P6 and output to the read data line RDL. In the write operation, the control signal line /WE of the negative logic is controlled to be low, data input from the write data line /WDL is output to the global bit line GBL through the PMOS transistors P5 and P7.

Figure 4:
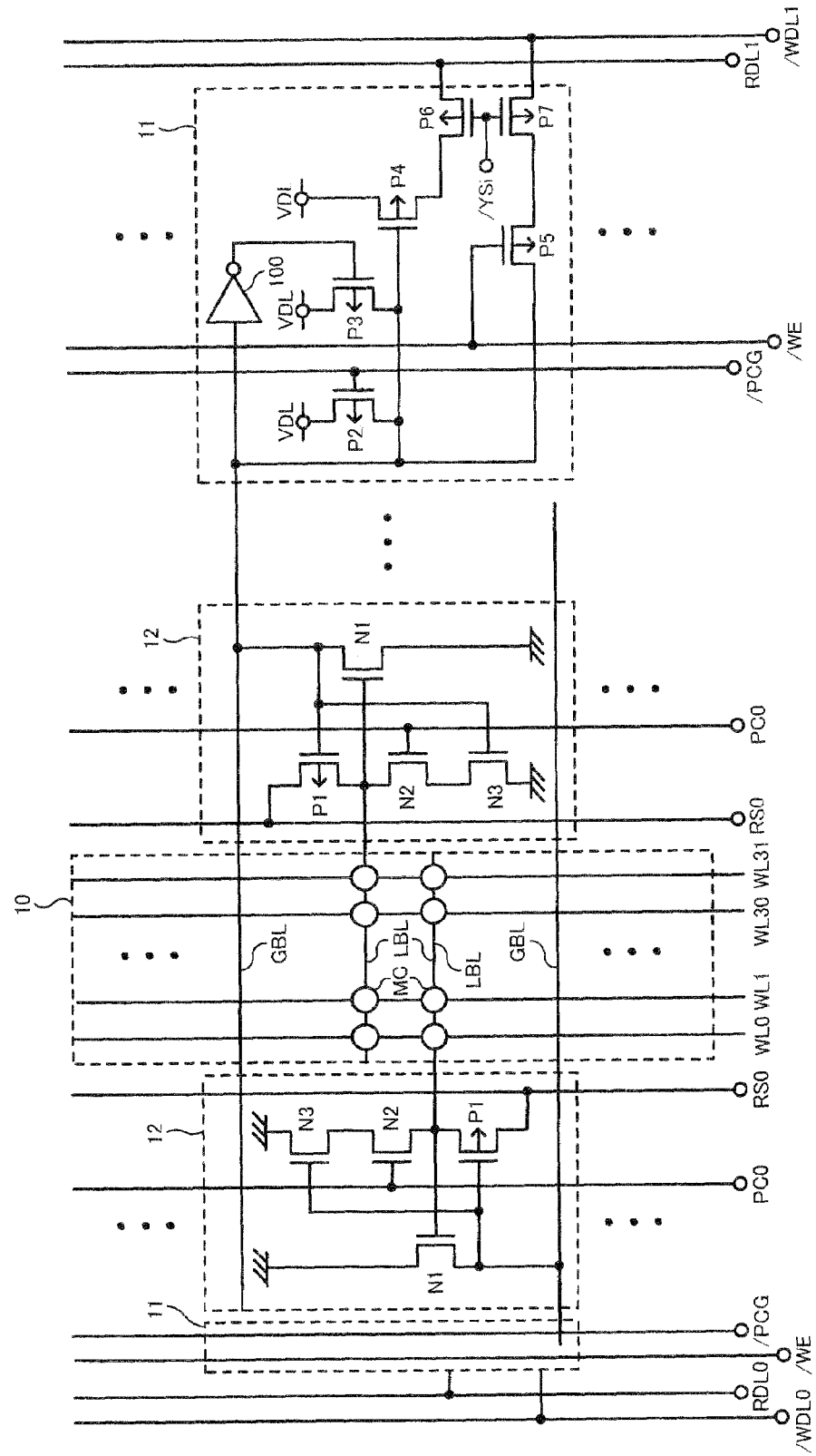
FIG. 4 is a diagram showing a configuration of a unit circuit of the first embodiment.

Next, circuit configuration and operation of the DRAM using the local sense amplifier 12 of FIG. 2 and the global sense amplifier 11 of FIG. 3 will be described with reference to FIGS. 4 to 6. The circuit configuration of FIG. 4 shows a unit circuit including two global bit lines GBL adjacent to each other in FIG. 1. Among N/2 unit circuits arranged for N global bit lines GBL of FIG. 1, one unit circuit placed at an i-th position from the top of FIG. 1 is shown in FIG. 4. However, in the unit circuit of FIG. 4, the circuit configurations of the left-side memory cell array 10, two local sense amplifiers 12 on both sides thereof, and the global sense amplifier 11 at the right end are only shown, and other circuit configurations are omitted.

As shown in FIG. 4, one of two local bit lines LBL of the memory cell array 10 is connected to the right-side local sense amplifier 12, and the other thereof is connected to the left-side local sense amplifier 12. These two local sense amplifiers 12 are assumed to have the same configuration as FIG. 2, but their arrangements are rotated by 180 degrees relative to each other for the convenience. Further, in FIG. 4, one of two global bit lines GBL is connected to the right-side global sense amplifier 11, and the other thereof is connected to the left-side global sense amplifier 11 (its circuit configuration is omitted). These two global sense amplifiers 11 are assumed to have the same configuration as FIG. 3.

Here, some signal names have numbers (for example, RDL0, RDL1) in FIG. 4, and these numbers mean that different control signals are supplied in accordance with the arrangement of the global sense amplifiers 11, the memory cell array 10 or the like. In the following, if signal names are required to be distinguished, they are represented in the same manner, and if they are not required to be distinguished, signal names are represented without the numbers.

A precharge signal line PC0 and a drive control line RS0 are connected to local sense amplifiers 12 on both sides of the left-side memory cell array 10 of FIG. 4. Besides, a precharge signal line PC1 and a drive control line RS1 are connected to local sense amplifiers 12 on both sides of the adjacent memory cell array 10. The control signal line /WE and the precharge signal line /PCG are connected to two global sense amplifiers 11 at both ends. Meanwhile, a read data line RDL0 and a write data line /WDL0 are connected to the left-side global sense amplifier 11, while a read data line RDL1 and a write data line /WDL1 are connected to the right-side global sense amplifier 11. Moreover, 32 word lines WL0 to WL31 are arranged in the above-mentioned memory cell array 10, and memory cells MC are formed at all intersections of the local bit lines LBL intersecting therewith. Besides, the memory cell array 10, the local sense amplifier 12 and the global sense amplifier 11 at the left end are configured in the same manner (which are not shown).

The read and write operations in the circuit configuration of FIG. 4 will be described with reference to FIGS. 5 and 6. FIG. 5 shows waveforms in an operation in which a high level is read out from a selected memory cell first and thereafter a low level is written to the selected memory cell. Seven terminals (T1 to T7) into which the entire operation is divided are shown in the upper side of FIG. 5. Before a precharge cancel period T1, the local bit line LBL and the global bit line GBL are in a precharge state, and the local bit line LBL is in low and the global bit line GBL is in high. Then, during the precharge cancel period T1, the precharge signal line PC0 changes from high to low in order to cancel the precharge state of the local bit line LBL, and the precharge signal line /PCG changes from low to high in order to cancel the precharge state of the global bit line GBL.

During a cell selecting period T2, the drive control line RS0 corresponding to the selected memory cell array 10 goes high so that the local sense amplifier 12 is activated. Besides, precharge signal lines PC (for example, PC1) corresponding to non-selected memory cell arrays 10 remain high, and drive control lines RS (for example, RS1) remain low. Further, the level of the selected word line WL0 rises from a negative voltage VKK to a positive voltage VPA. The negative voltage VKK is set to a value lower than "low level" (ground potential VSS), and the positive voltage VPA is set to a value higher than "high level" (power supply voltage VDL). As a result, a signal of high level stored in a memory cell MC at an intersection of the word line WL0 and the local bit line LBL is read out and input to the local sense amplifier 12, thereby increasing the local bit line LBL to a predetermined potential.

At this point, the predetermined potential of the local bit line LBL is set to a value (for example, 0.7V) higher than at least a threshold voltage range Rvt (represented by hatching in FIG. 5) of the NMOS transistor N1. The threshold voltage range Rvt is distributed with a predetermined voltage width depending on temperature fluctuation or process fluctuation. Subsequently, during a sensing period T3, the level of the global bit line GBL falls from high to low via the NMOS transistor N1 which has turned on. Meanwhile, the PMOS transistor P1, to the gate of which the global bit line GBL is connected, turns on, and thus the local bit line LBL is amplified to the level of the power supply voltage VDL from the above predetermined potential.

During a read period T4, a select signal line /YSi connected to a selected global sense amplifier 11 is controlled to be low, so as to turn on the PMOS transistors P6 and P7. Thereby, the low level of the global bit line GBL is inverted and read out via the PMOS transistors P4 and P6, and the same high level as the memory cell MC is output to the read data line RDL1. Thereby, one read operation of the DRAM is completed. Here, the precharge signal line PC0 returns to high during the read period T4. Thus, thereafter, the NMOS transistor N2 remains on, and the PMOS transistor P1 and the NMOS transistor N3 function as the inverting circuit.

Next, the write operation for the same memory cell MC is subsequently performed. During a write period T5, the control signal line /WE changes from high to low. Thereby, the PMOS transistor P5 of the global sense amplifier 11 turns on, and the write data line /WDL1 is connected to the global bit line GBL. Then, the write data line /WDL1 is controlled so that write data of the low level is inverted to be high, and thus the global bit line GBL changes to high. Meanwhile, the local bit line LBL changes to low due to the inverting operation of the above PMOS transistor P1 and the NMOS transistor N3. Thereby, low level data is written to the selected memory cell MC through the local bit line LBL.

During a cell selecting cancel period T6, the selected word line WL0 falls to the negative voltage VKK from the positive voltage VPA. Subsequently, the select signal line /YSi is controlled to be high, and the write data line /WDL1 is disconnected from the global bit line GBL. Thereby, one write operation of the DRAM is completed.

During a precharge start period T7, the precharge signal line /PCG changes to low in order to precharge the global bit line GBL again. Thereafter, the drive control line RS0 corresponding to the selected memory cell array 10 changes to low, and the local sense amplifier 12 is inactivated.

Figure 5:
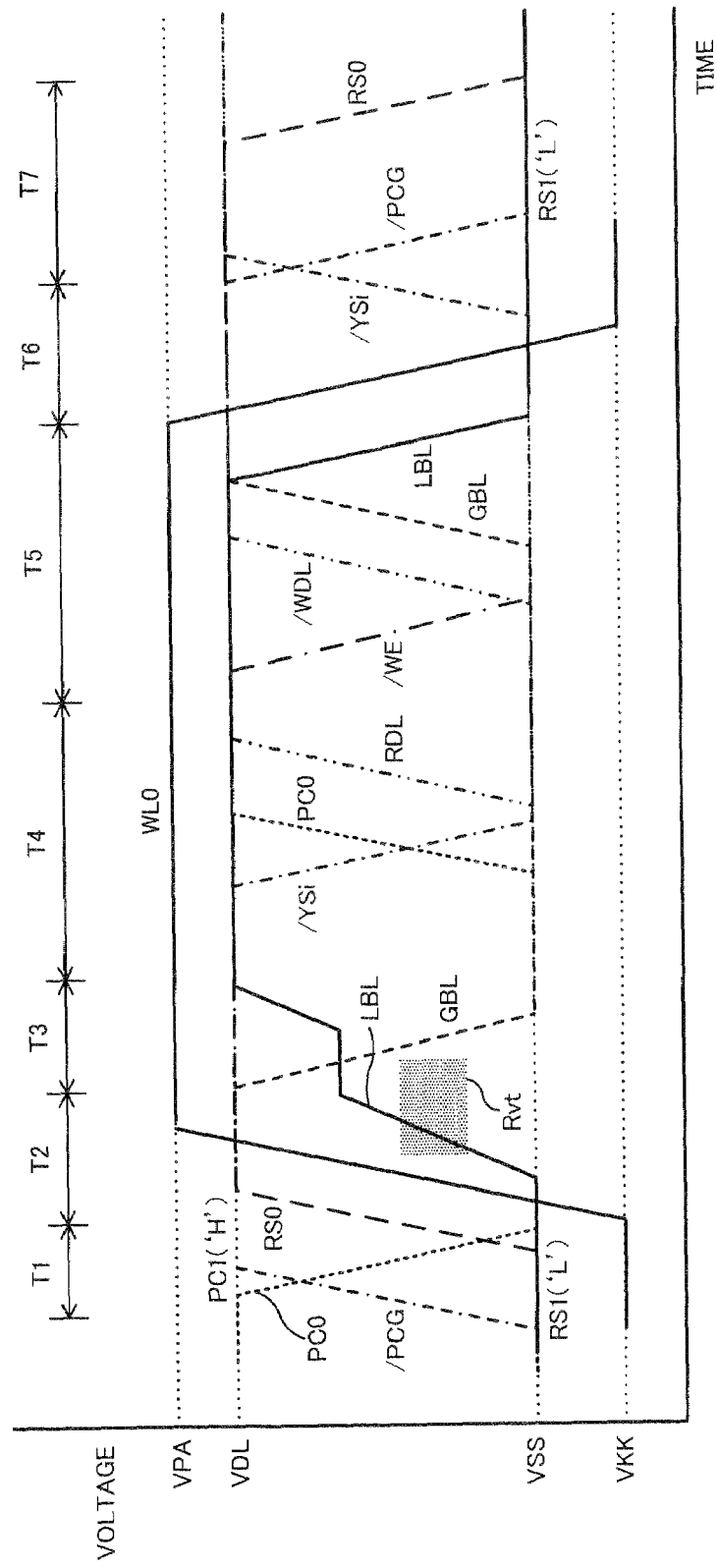
FIG. 5 is a diagram explaining read and write operations in the circuit configuration of FIG. 4 and showing waveforms in an operation of reading out a high level first and writing a low level.
Figure 6:
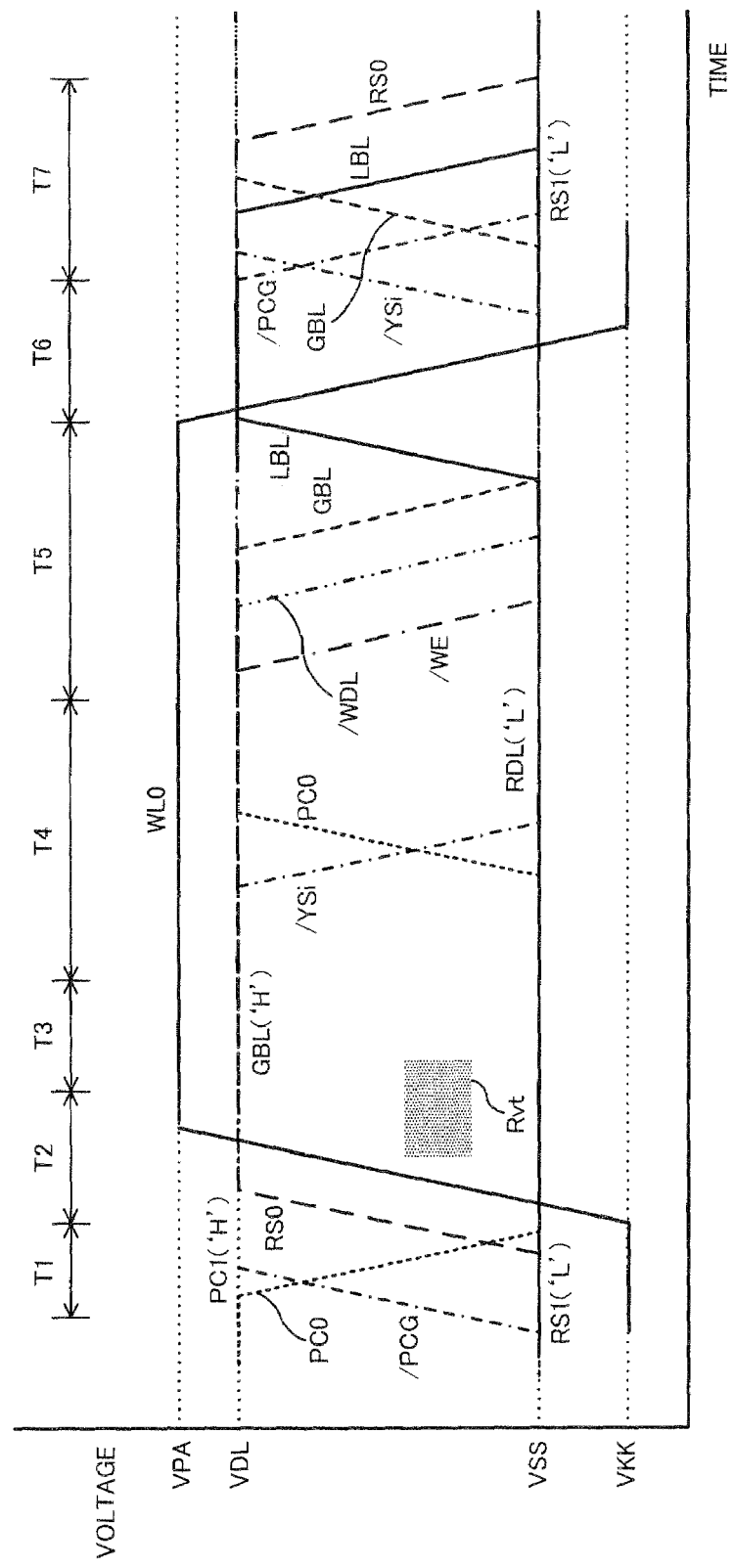
FIG. 6 is a diagram explaining read and write operations in the circuit configuration of FIG. 4 and showing waveforms in an operation of reading out a low level first and writing a high level.

FIG. 6 shows waveforms in an operation in which a low level is read out from the selected memory cell first and thereafter a high level is written to the selected memory cell. Although basic control in this case is almost common to that of FIG. 5, some signal waveforms such as the local bit line LBL, the global bit line GBL and the like are different.

During the cell selecting period T2, the local bit line LBL remains low by reading out the low data of the memory cell MC, and during the sensing period T3, the global bit line GBL remains high by inverting the low level of the local bit line LBL. Thus, during the read period T4, a low level is read out to the read data line RDL1. Further, during the write period T5, since the write data line /WDL1 is controlled to be low, the global bit line GBL changes to low and the local bit line LBL changes to high. Moreover, during the precharge start period T7, the global bit line GBL returns to high, and the local bit line LBL returns to low, so that they are precharged respectively.

By employing the above configuration of the first embodiment, memory cells MC are formed at all intersections of the local bit lines LBL and the word lines WL in the hierarchical memory cell array 10, and an increase in layout area can be suppressed by using the single-ended local sense amplifiers 12. Since the signal read out from the memory cell MC is input/output from/to an external data line through the local bit line LBL, the local sense amplifier 12, the global bit line GBL and the global sense amplifier 11 in this order, the parasitic capacitance and resistance of the local bit line LBL and the global bit line GBL are suppressed, and sufficient signal amount is obtained so as to improve the access speed and the operating margin.

Second Embodiment

Figure 7:
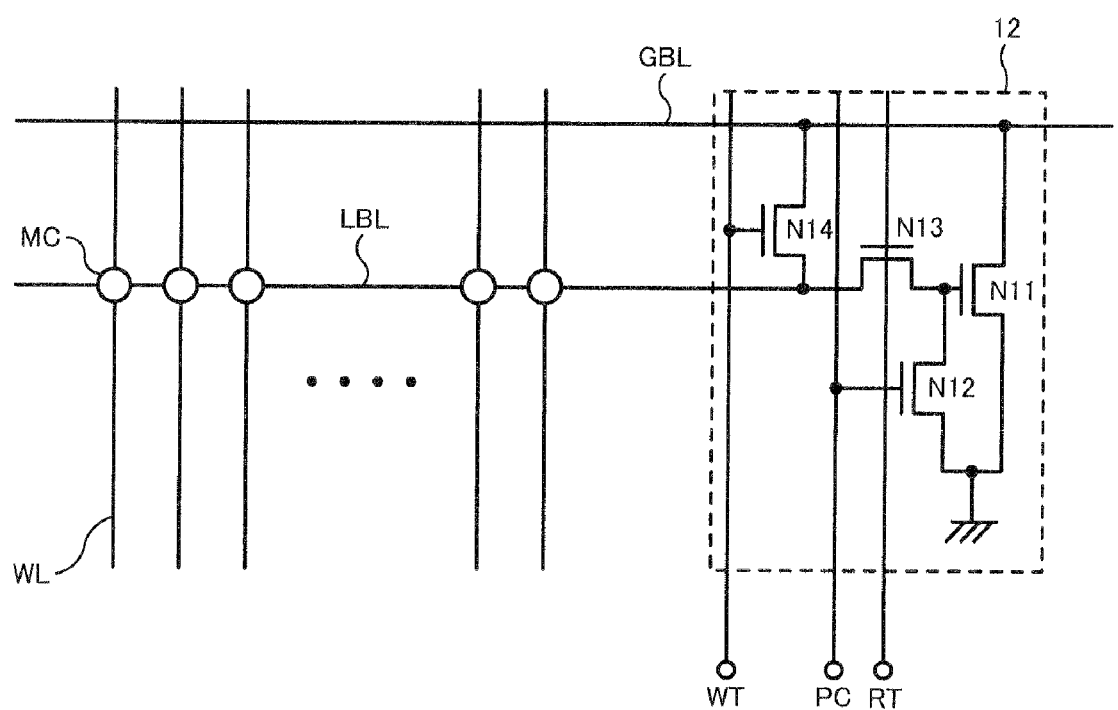
FIG. 7 is a diagram showing a configuration example of a local sense amplifier of a second embodiment.

A second embodiment of the present invention will be described. The entire configuration of a DRAM of the second embodiment is the same as the first embodiment (FIG. 1), so description thereof is omitted. FIG. 7 shows a configuration example of the local sense amplifier 12 of the second embodiment. The local sense amplifier 12 of FIG. 7 is a single-ended sense amplifier including four NMOS transistor N11, N12, N13 and N14. In the second embodiment, since the local sense amplifier 12 is configured using only NMOS transistors without using PMOS transistors, a well for separating PMOS and NMOS areas is not required, so that the layout area of the local sense amplifier 12 can be further reduced.

In FIG. 7, the NMOS transistor N11 is connected between the global bit line GBL and ground in the same manner as the NMOS transistor N1 of FIG. 2. Meanwhile, the NMOS transistor N12 is connected between the gate of the NMOS transistor N11 and ground, and the NMOS transistor N13 is connected between the gate of the NMOS transistor N11 and the local bit line LBL. Further, the NMOS transistor N14 is connected between the global bit line GBL and the local bit line LBL. Moreover, the precharge signal line PC is connected to the gate of the NMOS transistor N12, a control signal line RT is connected to the gate of the NMOS transistor N13, and a control signal line WT is connected to the gate of the NMOS transistor N14.

In the precharge operation of the local sense amplifier 12 of FIG. 7, both the precharge signal line PC and the control signal line RT go high, the local bit line LBL is precharged to the ground potential VSS. In the read operation of the local sense amplifier 12, the precharge signal line PC is controlled to be low, the control signal line RT is controlled to be high, and the control signal line WT is controlled to be low, respectively. Then, the data read out to the local bit line LBL is inverted and output to the global bit line GBL via NMOS transistor N13 and N11. Thereafter, the precharge signal line PC changes to high, the control signal line RT changes to low, and the control signal line WT changes to high. Then, rewriting to the selected memory cell MC is performed on the local bit line LBL via the NMOS transistor N14. Meanwhile, in the write operation of the local sense amplifier 12, the precharge signal line PC is controlled to be high, the control signal line RT is controlled to be low, and the control signal line WT is controlled to be high, respectively. Then, the local bit line LBL is disconnected from the NMOS transistor N11, while the global bit line GBL and the local bit line LBL are connected to each other via the NMOS transistor N14, and writing to the selected memory cell MC is performed.

A configuration example of the global sense amplifier 11 of the second embodiment will be described with reference to FIG. 8. The global sense amplifier 11 of FIG. 8 includes five NMOS transistor N15, N16, N17, N18, N19, two PMOS transistors P11, P12 and two inverters 101, 102.

The two inverters 101 and 102 form a latch, the PMOS transistor P11 is connected between the global bit line GBL and the input of the latch, and the PMOS transistor P12 is connected between the power supply voltage VDL and the input of the latch. The NMOS transistor N15 is connected between the global bit line GBL ant the output of the latch, and the NMOS transistors N16 and N18 are connected in series between the write data line WDL and the output of the latch. The NMOS transistors N19 and N17 are connected in series between the read data line /RDL and ground, and the gate of the NMOS transistor N17 is connected to the output of the latch.

Meanwhile, the select signal line YS is connected to gates of the NMOS transistors N18 and N19. The control signal line WE is connected to the gate of the NMOS transistor N16. The control signal line RW is connected to gates of the NMOS transistor N15 and the PMOS transistor P11. The precharge signal line /PCG is connected to the gate of the PMOS transistor P12.

Figure 8:
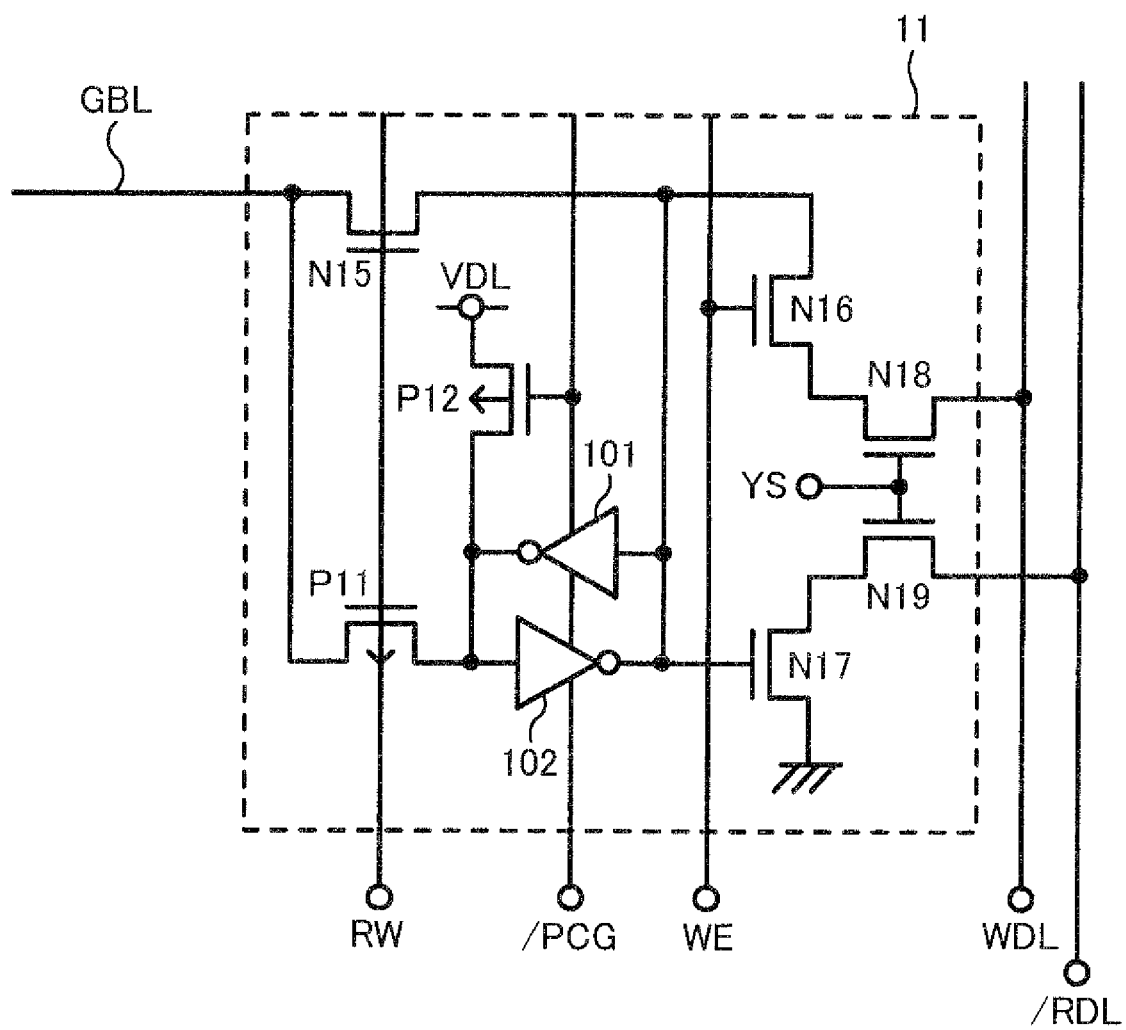
FIG. 8 is a diagram showing a configuration example of a global sense amplifier of the second embodiment.

In a precharge operation of the global sense amplifier 11 of FIG. 8, the precharge signal line /PCG goes low and the global bit line GBL is precharged to the level of the power supply voltage VDL via the PMOS transistor P12. In a read operation, the control signal line RW goes low, and the NMOS transistor N15 turns off while the PMOS transistor 11 turns on. Then, data of the global bit line GBL is captured in the latch and output to the read data line RDL via the NMOS transistors N17 and N19. Thereafter, the control signal line RW goes high, the inverted data stored in the latch is transmitted to the global bit line GBL via the NMOS transistor N15 so as to be rewritten to the memory cell MC. In the write operation, the control signal line WE further goes high, data of the write data line WDL is transmitted to the global bit line GBL via the NMOS transistors N18, N16 and 15.

Figure 9:
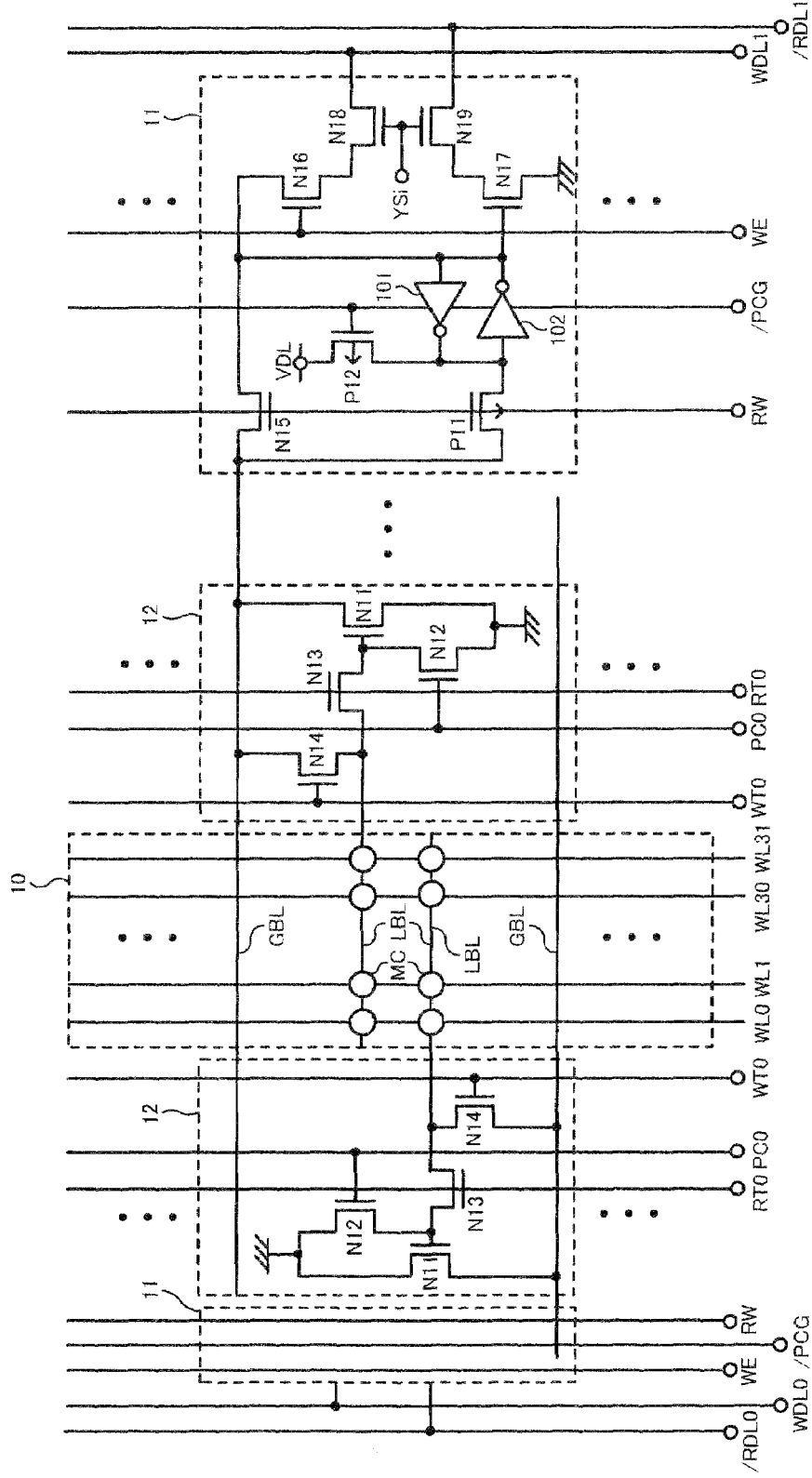
FIG. 9 is a diagram showing a configuration of a unit circuit of the second embodiment.

Next, circuit configuration and operation of the DRAM using the local sense amplifier 12 of FIG. 7 and the global sense amplifier 11 of FIG. 8 will be described with reference to FIGS. 9 to 11. FIG. 9 shows a unit circuit as in FIG. 4 of the first embodiment. The configuration shown in FIG. 9 is almost the same as that in FIG. 4 except circuit configurations of the local sense amplifier 12 and the global sense amplifier 11 and except arrangements of signal lines.

Read and write operations in the circuit configuration of FIG. 9 will be described with reference to FIGS. 10 and 11. FIG. 10 shows waveforms in the operation in which a high level is read out from a selected memory cell first and thereafter a low level is written to the selected memory cell and shows divided seven terminals (T1 to T7), as in FIG. 5 of the first embodiment. Most of basic controls in FIG. 10 are common to those in FIG. 5, and different points will be mainly described below.

Figure 10:
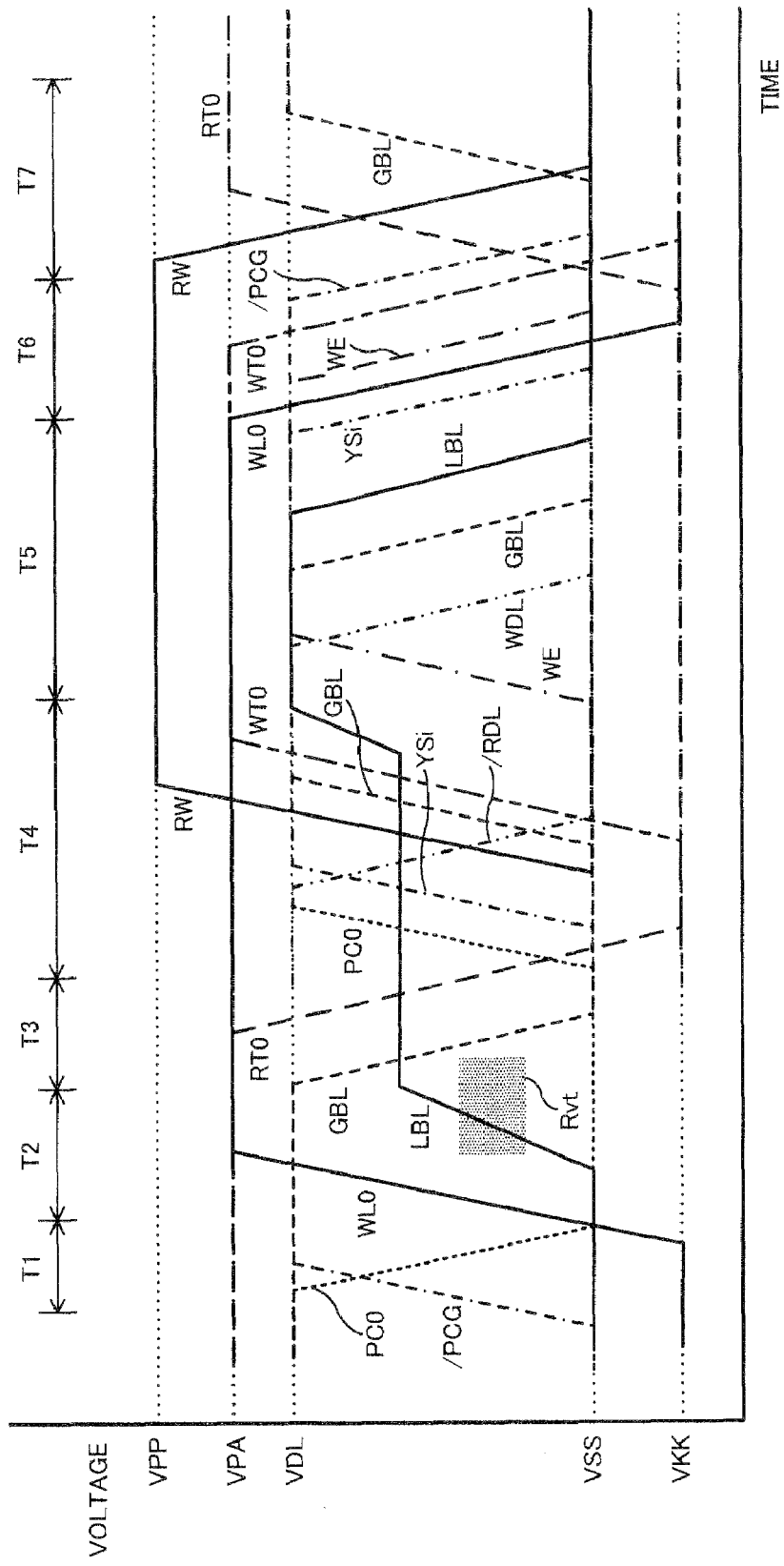
FIG. 10 is a diagram explaining read and write operations in the circuit configuration of FIG. 9 and showing waveforms in an operation of reading out a high level first and writing a low level.

During the precharge cancel period T1 and the cell selecting period T2, the drive control line RS0 in FIG. 5 does not exist in FIG. 10, however the control signal line RT0 remains the positive voltage VPA. The control signal line RT0 is controlled to be the positive voltage VPA and the negative voltage VKK in the same manner as the word line WL in order to reliably switch on/off the NMOS transistor N13 of the local sense amplifier 12. Meanwhile, after the global bit line GBL changes form high to low due to the operation of the NMOS transistor N11, the control signal line RT0 falls to the negative voltage VKK from the positive voltage VPA, and the local bit line LBL is disconnected from the NMOS transistor N11.

During the read period T4, the select signal line YSi is controlled to be high, so that the NMOS transistors N18 and N19 of the global sense amplifier 11 turn on. Thereby, the low level of the global bit line GBL is read out through a path from the PMOS transistor P11 to the NMOS transistor N19, a signal of low level obtained by inverting a signal of high level stored in a memory cell MC is output to the read data line /RDL1. Subsequently, the control signal line RW rises to the positive voltage VPP. The control signal line RW is controlled to be the positive voltage VPP higher than the positive voltage VPA and to be the ground potential VSS in order to reliably switch on/off the NMOS transistor N15 and the PMOS transistor P11.

At this point, the inverted data stored in a latch formed by inverters 101 and 102 is output to the global bit line GBL via the NMOS transistor N15, and its level is inverted from low to high. Then, the control signal line WT0 rises to the positive voltage VPA, and the NMOS transistor N14 of the local sense amplifier 12 turns on. Thereby, the level of the local bit line LBL is increased to the level of the power supply voltage VDL through the global bit line GBL, and the high level is rewritten to the memory cell MC. Thus, one read operation of the DRAM is completed. In addition, the control signal line WT0 is controlled to be the positive voltage VPA and the negative voltage VKK in the same manner as the control signal line RT0.

Subsequently, during the write period T5, when the control signal line WE changes from low to high, the NMOS transistor N16 of the global sense amplifier 11 turns on, and the write data line WDL1 is connected to the global bit line GBL. Since the write data line WDL1 is controlled to be low, the global bit line GBL also changes to low, and the local bit line LBL changes to low via the above NMOS transistor N14. Thereby, low level data is written to the selected memory cell MC through the local bit line LBL.

During the cell selecting cancel period T6, the select signal line YSi is controlled to be low, the selected word line WL0 falls to the negative voltage VKK, and the control signal line WE is controlled to be low. Thereafter, the control signal line WT0 falls to the negative voltage VKK, and the local bit line LBL and the global bit line GBL are disconnected from each other. Thus, one write operation of the DRAM is completed.

During the precharge start period T7, the precharge signal line /PCG changes to low, and additionally the control signal line RW is controlled to be low while the control signal line RT0 is controlled to be high. Thereby, the local bit line LBL is precharged to the ground potential VSS by the NMOS transistor N12, and the global bit line GBL is precharged to the power supply voltage VDL by the PMOS transistor P12.

Figure 11:
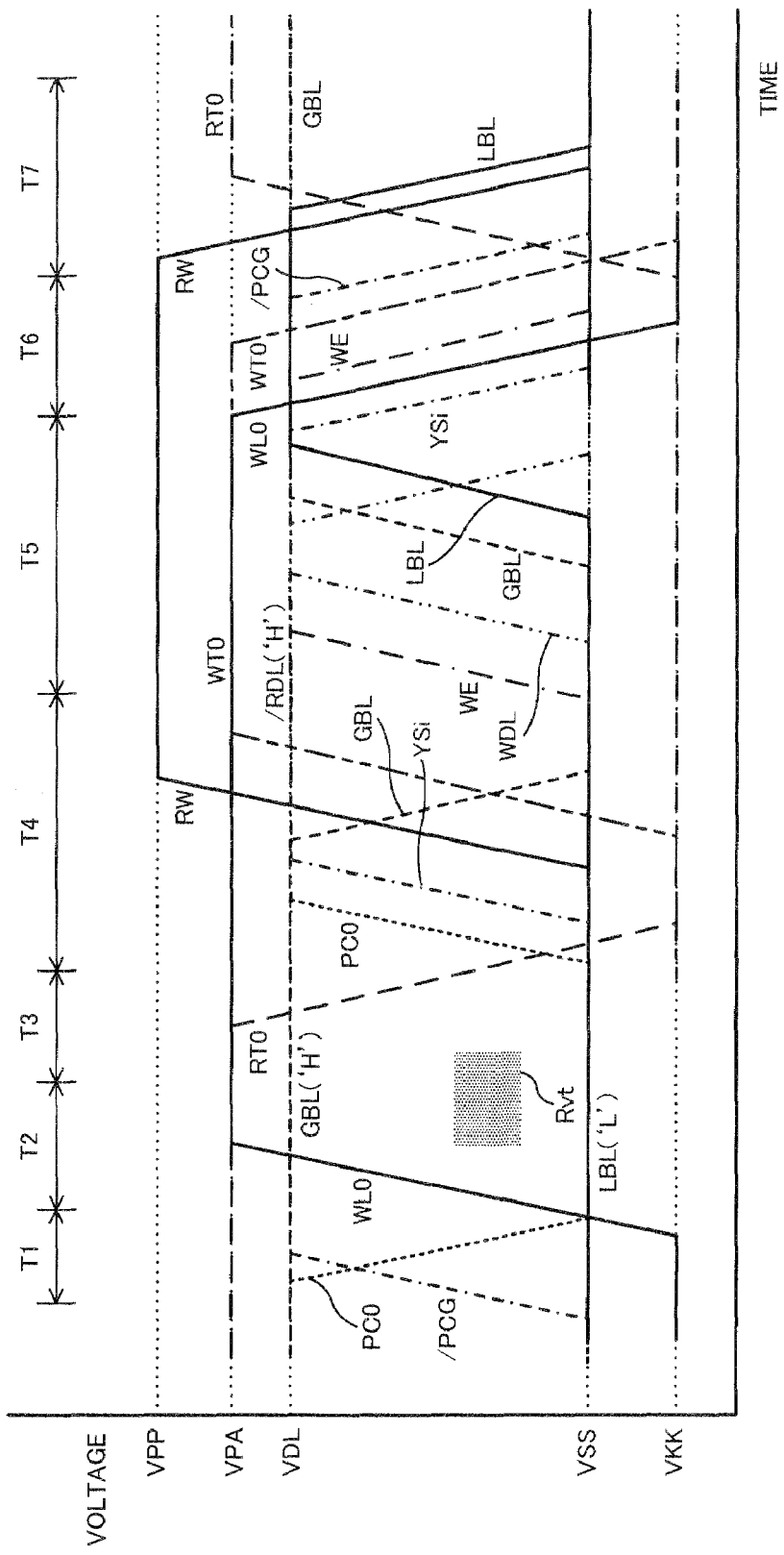
FIG. 11 is a diagram explaining read and write operations in the circuit configuration of FIG. 9 and showing waveforms in an operation of reading out a low level first and writing a high level.

FIG. 11 shows waveforms in the operation in which a low level is read out from the selected memory cell first and thereafter a high level is written to the selected memory cell, as in FIG. 6 of the first embodiment. Although basic control of FIG. 11 is almost common to that of FIG. 10, some signal waveforms such as the local bit line LBL, the global bit line GBL and the like are different.

During the cell selecting period T2, since low data of the memory cell MC is read out, the local bit line LBL remains low, and during the sensing period T3, the global bit line GBL remains high by inverting the low level of the local bit line LBL. Thus, during the read period T4, a high level is read out to the read data line /RDL1. Further, during the write period T5, since the write data line WDL1 is controlled to be high, the global bit line GBL changes to high, and the local bit line LBL also changes to high. Moreover, during the precharge start period T7, the global bit line GBL remains high, and the local bit line LBL returns to low, so that they are precharged respectively.

By employing the above configuration of the second embodiment, the same function and effect as the first embodiment can be obtained, and additionally the local sense amplifier 12 can be configured using only NMOS transistors. Thus, it is advantageous for reducing the layout area of the entire DRAM. The advantage of the second embodiment is common to that of a third embodiment described bellow.

Third Embodiment

Figure 12:
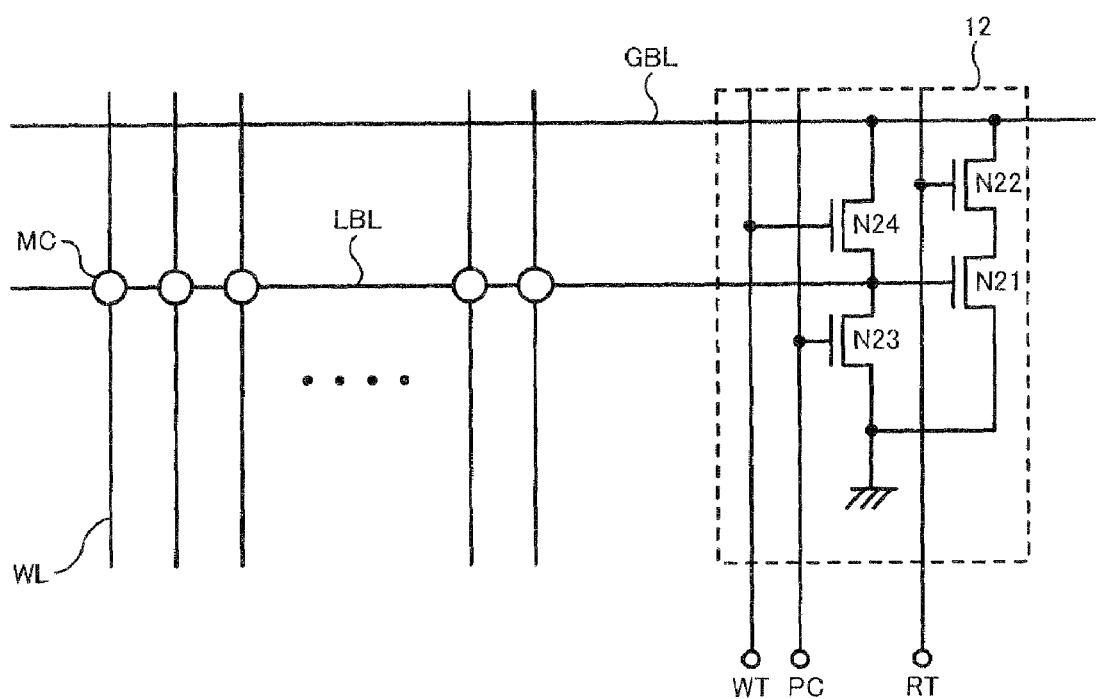
FIG. 12 is a diagram showing a configuration example of a local sense amplifier of a third embodiment.

A third embodiment of the present invention will be described. The entire configuration of a DRAM of the third embodiment is the same as the first embodiment (FIG. 1), so description thereof is omitted. FIG. 12 shows a configuration example of the local sense amplifier 12 of the third embodiment. The local sense amplifier 12 of FIG. 12 is a single-ended sense amplifier including four NMOS transistor N21, N22, N23 and N24. In the third embodiment, it is common to the second embodiment that the layout area can be reduced by configuring the local sense amplifier 12 using only NMOS transistors, however its circuit configuration is different.

In FIG. 12, NMOS transistor N21, N23 and N24 have the same functions as those of the NMOS transistor N11, N12 and N14 of FIG. 7. Meanwhile, the NMOS transistor 13 of FIG. 7 is not provided, and the NMOS transistor N22 is connected between the global bit line GBL and the NMOS transistor N21. The control signal line RT is connected to the gate of the NMOS transistor N22.

In the precharge operation of the local sense amplifier 12 of FIG. 12, the precharge signal line PC goes high, both the control signal lines RT and WT go low, and the local bit line LBL is precharged to the ground potential VSS. In the read operation of the local sense amplifier 12, the precharge signal line PC is controlled to be low, the control signal line RT is controlled to be high, and the control signal line WT is controlled to be low, respectively. Then, the data read out to the local bit line LBL is inverted and output to the global bit line GBL via NMOS transistors N21 and N22. Thereafter, the control signal line RT changes to low, the control signal line WT changes to high, and rewriting to the selected memory cell MC is performed on the local bit line LBL via the NMOS transistor N24. Meanwhile, in the write operation of the local sense amplifier 12, the precharge signal line PC is controlled to be low, the control signal line RT is controlled to be low, and the control signal line WT is controlled to be high, respectively. Then, the global bit line GBL and the local bit line LBL are connected to each other via the NMOS transistor N24, and rewriting to the selected memory cell MC is performed.

Figure 13:
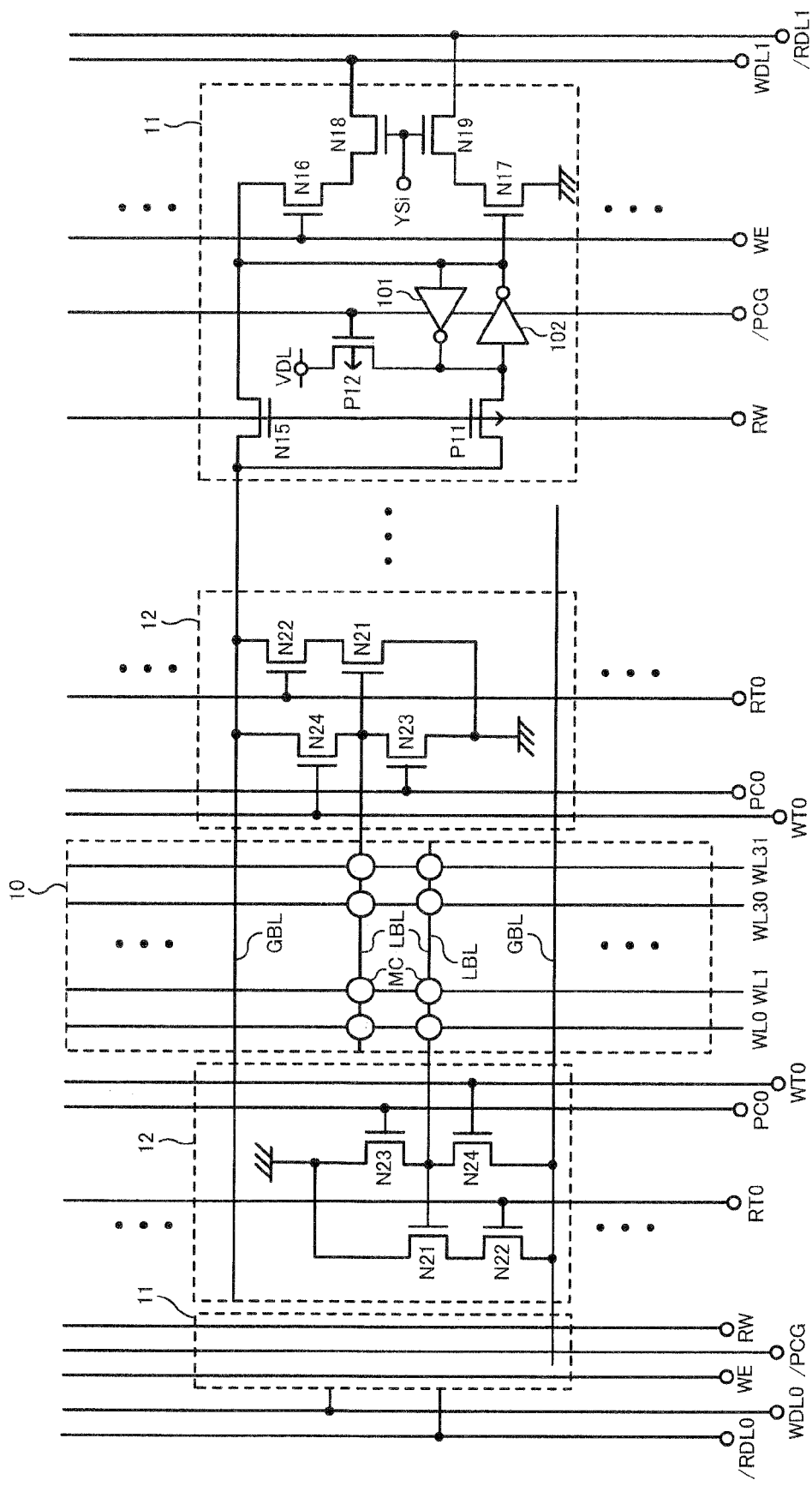
FIG. 13 is a diagram showing a configuration of a unit circuit of the third embodiment.
Figure 14:
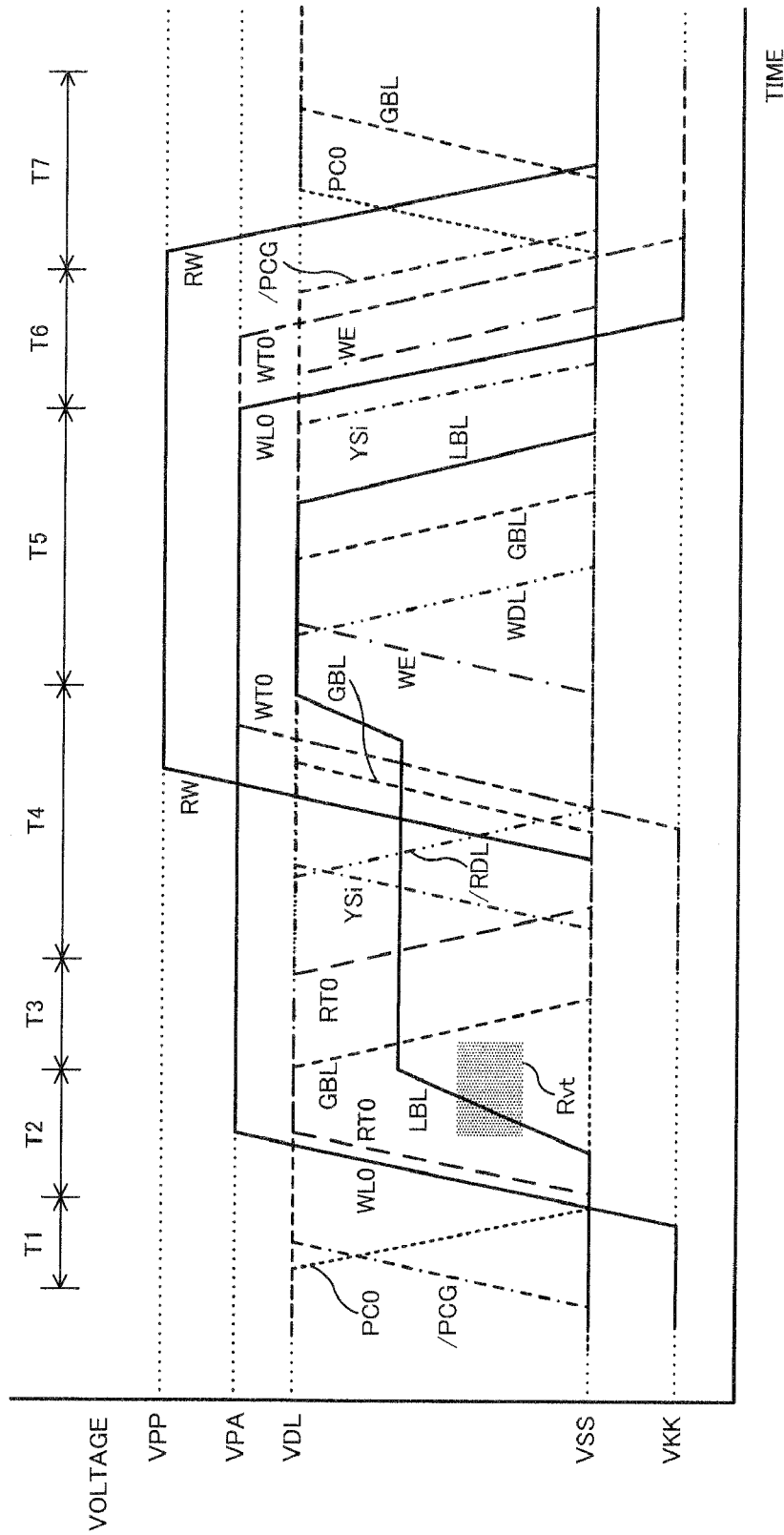
FIG. 14 is a diagram explaining read and write operations in the circuit configuration of FIG. 13 and showing waveforms in an operation of reading out a high level first and writing a low level.

Next, circuit configuration and operation of the DRAM using the local sense amplifier 12 of FIG. 12 will be described with reference to FIGS. 13 to 15. FIG. 13 shows a unit circuit as in FIG. 4 (FIG. 9) of the first (second) embodiment. Here, the global sense amplifier 11 of the third embodiment is assumed to have the same configuration as in the second embodiment (FIG. 8). The configuration as shown in FIG. 13 is almost the same as those in FIGS. 4 and 9 except circuit configurations of the local sense amplifier 12 and the global sense amplifier 11 and except arrangements of signal lines.

Read and write operations in the circuit configuration of FIG. 13 will be described with reference to FIGS. 14 and 15. FIG. 14 shows waveforms in the operation in which a high level is read out from a selected memory cell first and thereafter a low level is written to the selected memory cell and shows divided seven terminals (T1 to T7), as in FIG. 5 (FIG. 10) of the first (second) embodiment. Most of basic controls in FIG. 15 are common to those in FIG. 10, and different points will be mainly described below.

During the precharge cancel period T1 and the cell selecting period T2, the control signal line RT0 remains low at the beginning and thereafter rises to high when selectively driving the word line WL0. The level of the control signal line PT0 is controlled to be the power supply voltage VDL and the ground potential VSS, as different from FIG. 10. Meanwhile, after the global bit line GBL changes form high to low due to the operation of the NMOS transistor N21, the control signal line RT0 returns from high to low, and the global bit line GBL is disconnected from the NMOS transistor N21.

Operation during the read period T4 is almost the same as in FIG. 10, however a difference exists in that the precharge signal line PC0 remains low. That is, since the NMOS transistor N11 is disconnected from the local bit line LBL in FIG. 9, the gate of the NMOS transistor N11 is required to be stabilized at the ground potential VSS. However, since the local bit line LBL is directly connected to the gate of the NMOS transistor N21 in FIG. 13, the precharge signal line PC0 is not required to be controlled.

Operations during the write period T5 and the cell selecting cancel period T6 are the same as in FIG. 10. Further, operation during the precharge start period T7 is the same as in FIG. 10 except the above changes in the control signal line RT0 and the precharge signal line PC0. The control signal line RT0 has already gone low and holds this state, while the precharge signal line PC0 is controlled to be high.

Figure 15:
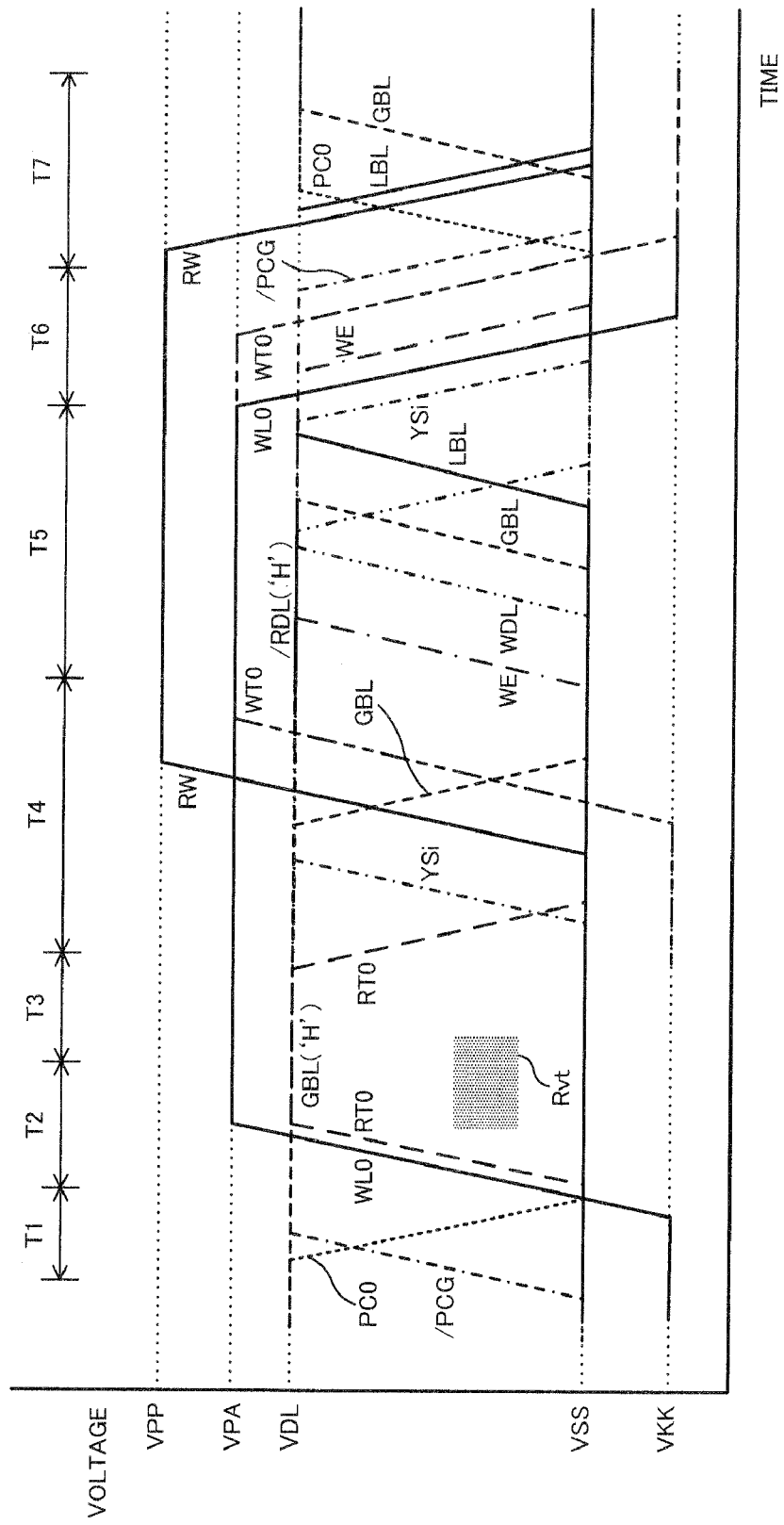
FIG. 15 is a diagram explaining read and write operations in the circuit configuration of FIG. 13 and showing waveforms in an operation of reading out a low level first and writing a high level.

FIG. 15 shows waveforms in the operation in which a low level is read out from the selected memory cell first and thereafter a high level is written to the selected memory cell, as in FIG. 6 (FIG. 11) of the first (second) embodiment. Although basic control of FIG. 15 is almost common to that of FIG. 14, some signal waveforms such as the local bit line LBL, the global bit line GBL and the like are different. Differences between signal waveforms of FIGS. 15 and 14 are equal to the differences between signal waveforms of FIGS. 11 and 10, so description thereof is omitted.

Fourth Embodiment

Figure 16:
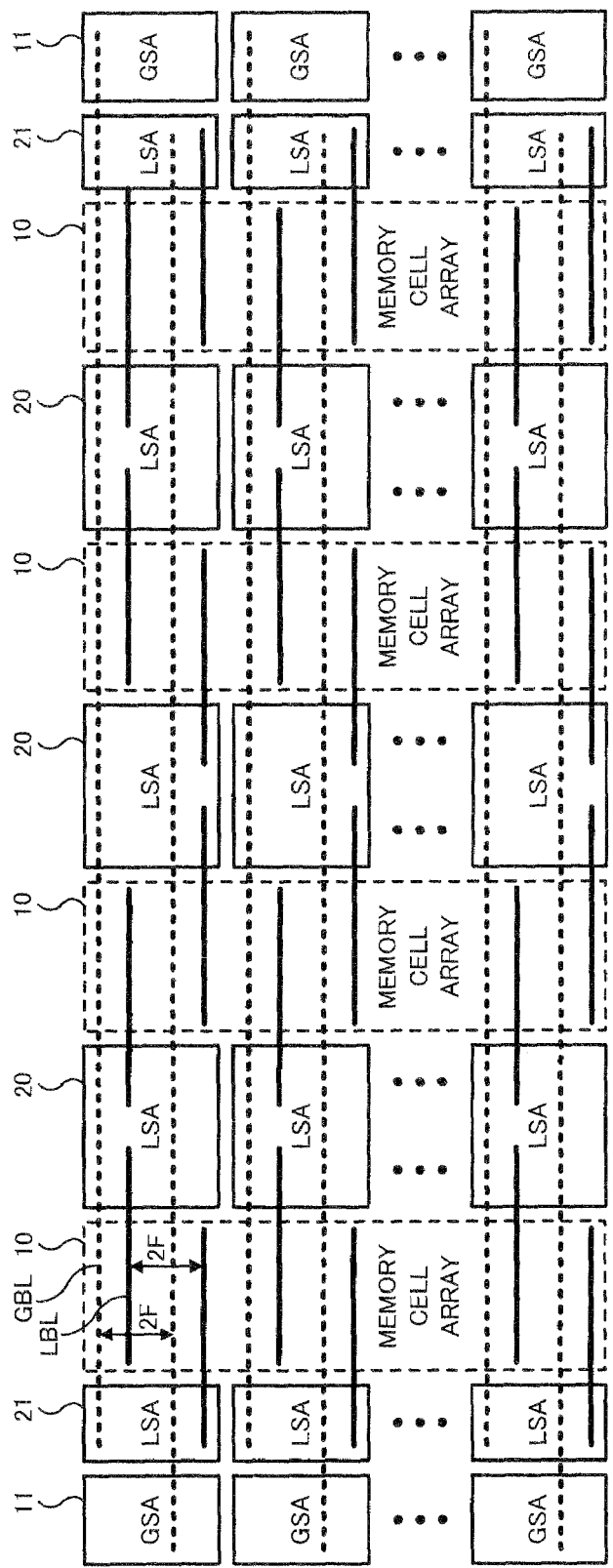
FIG. 16 is an entire configuration of a DRAM of a forth embodiment.

A fourth embodiment of the present invention will be described. In comparison with the entire configuration of the DRAMs of the first to third embodiments, a DRAM of the fourth embodiment differs in that adjacent memory cell arrays 10 share the local sense amplifier 20. FIG. 16 shows an entire configuration example of the DRAM of the fourth embodiment. In FIG. 16, there are shown four memory cell arrays 10, a plurality of global sense amplifiers 11, a plurality of shared local sense amplifiers 20 and a plurality of non-shared local sense amplifier 21, a plurality of global bit lines GBL, and a plurality of local bit lines LBL.

In FIG. 16, configurations of the four memory cell arrays 10 and the plurality of global sense amplifiers 11 are common to those of FIG. 1. Meanwhile, in the unit circuit including two global bit lines GBL, three shared local sense amplifiers 20 are arranged between memory cell arrays 10, two non-shared local sense amplifiers 21 are arranged at both ends of the four memory cell arrays 10. Two local bit lines LBL included in memory cell arrays 10 on both sides are connected to the sense amplifiers 20, thereby reading out and amplifying a selected local bit line LBL.

Figure 17:
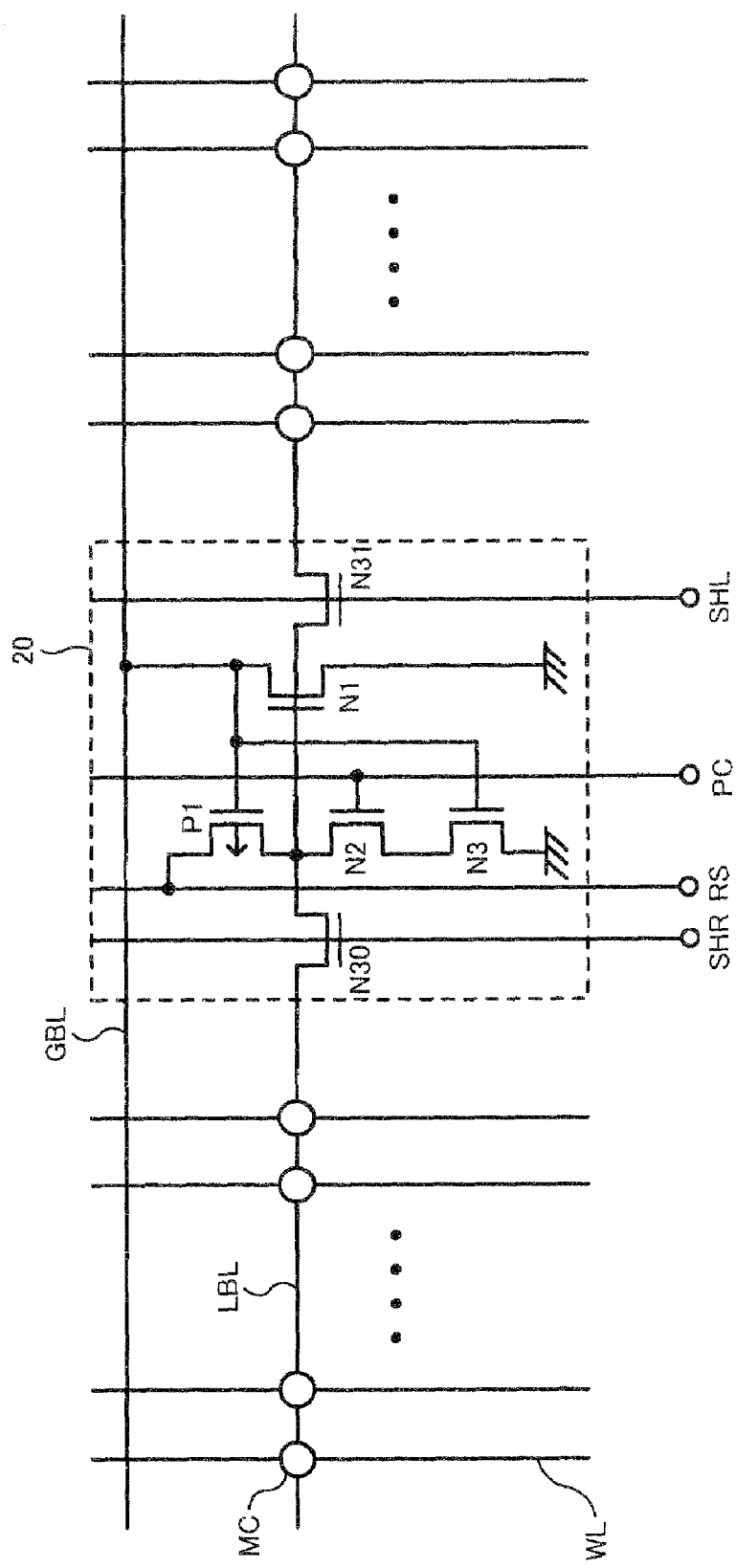
FIG. 17 is a diagram showing a configuration example of a shared local sense amplifier of the forth embodiment.

FIG. 17 shows a configuration example of the shared local sense amplifier 20 of FIG. 16. In FIG. 17, there are shown two local bit lines LBL included in two adjacent memory cell arrays 10, and the local sense amplifier 20 arranged therebetween. The shared local sense amplifier 20 of FIG. 17 includes NMOS transistor N30 and N31 as switching circuits, in addition to the PMOS transistor P1 and the three NMOS transistors N1 to N3 which are the same as in FIG. 2 of the first embodiment.

The PMOS transistor P1 and NMOS transistors N1 to N3, the precharge signal line PC and the drive control line RS have the same functions and operations as those in FIG. 2. Meanwhile, the NMOS transistor N30 is connected between an intermediate node (the gate of the NMOS transistor N1) of the PMOS transistor P1 and the NMOS transistor N2 and the left-side local bit line LBL, and the gate of the NMOS transistor N30 is connected to the switching signal line SHR. Further, the NMOS transistor N31 is connected between the above intermediate node and the right-side local bit line LBL, and the gate of the NMOS transistor N31 is connected to the switching signal line SHL.

The function of the two NMOS transistor N30 and 31 is to connect one local bit line LBL to the local sense amplifier 20 selectively. When the left-side memory cell array 10 is selected, the switching signal line SHR is controlled to be high and the switching signal line SHL is controlled to be low. When the right-side memory cell array 10 is selected, the switching signal line SHR is controlled to be low, and switching signal line SHL is controlled to be high. Actually, the selected memory cell array 10 is connected to two local sense amplifiers 20 on both sides, and the plurality of local bit lines LBL is alternately connected to the left and the right sides local sense amplifiers 20. Thus, the switching signal lines SHR and SHL are independently controlled for different local sense amplifiers 20 in the unit circuit.

Meanwhile, each of the two non-shared local sense amplifiers 21 at both ends of FIG. 16 includes one of the two NMOS transistors N30 and N31 in the configuration example of FIG. 17. That is, one non-shared local sense amplifier 21 includes only the NMOS transistor N31 whose gate is connected to the switching signal line SHL, while the other non-shared local sense amplifier 21 includes only the NMOS transistor N30 whose gate is connected to the switching signal line SHR.

Figure 18:
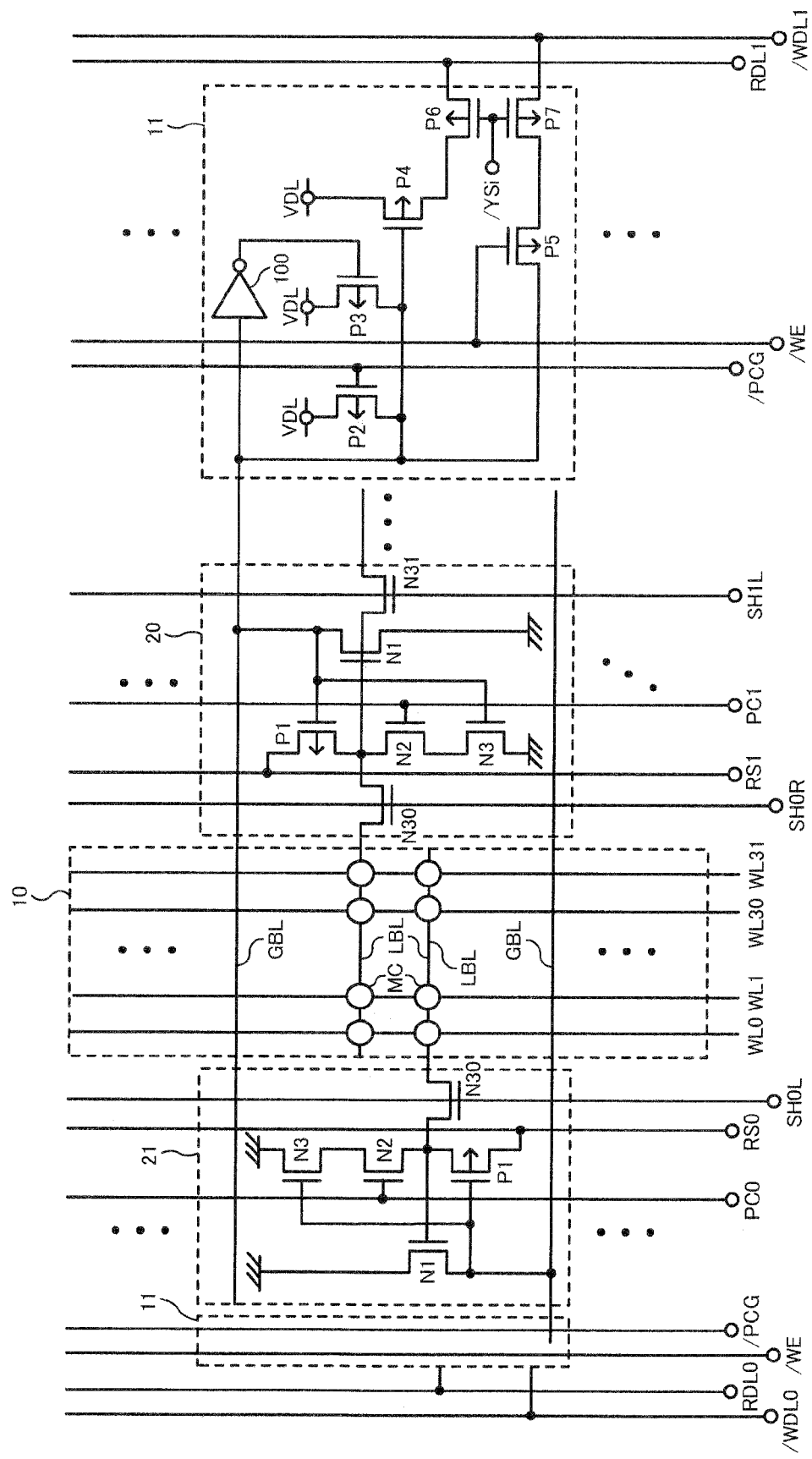
FIG. 18 is a diagram showing a configuration of a unit circuit of the fourth embodiment.
Figure 19:
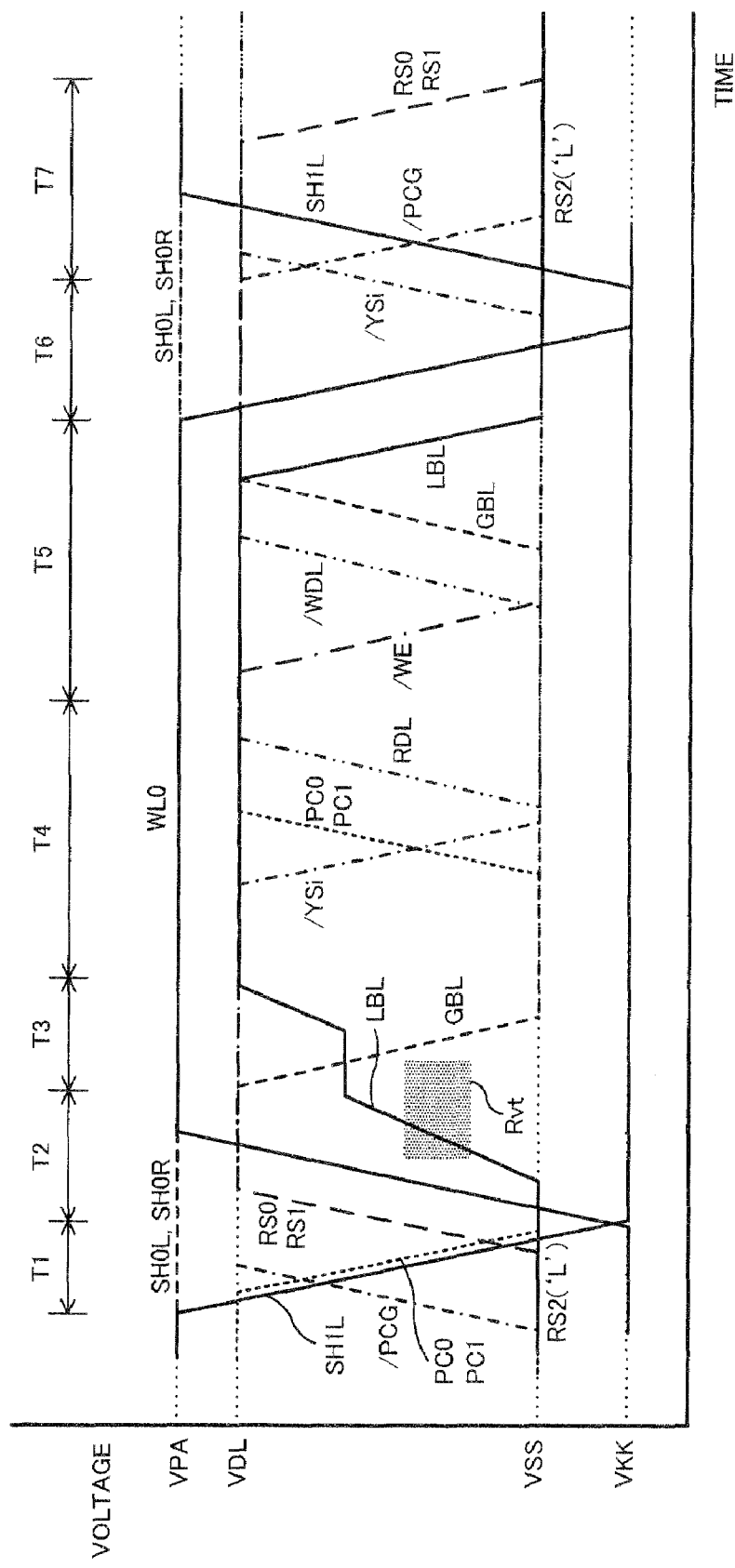
FIG. 19 is a diagram explaining read and write operations in the circuit configuration of FIG. 18 and showing waveforms in an operation of reading out a high level first and writing a low level.

Next, circuit configuration and operation of the DRAM of the fourth embodiment will be described with reference to FIGS. 18 to 20. FIG. 18 shows a unit circuit as in FIG. 4 of the first embodiment. Here, the global sense amplifier 11 of the fourth embodiment is assumed to have the same configuration as in the first embodiment (FIG. 3). The configuration as shown in FIG. 18 is almost the same as those in FIG. 4 except circuit configurations of the local sense amplifiers 20 and 21 and except arrangements of signal lines.

Read and write operations in the circuit configuration of FIG. 18 will be described with reference to FIGS. 19 and 20. FIG. 19 shows waveforms in the operation in which a high level is read out from a selected memory cell first and thereafter a low level is written to the selected memory cell and shows divided seven terminals (T1 to T7), as in FIG. 5 of the first embodiment. Most of basic controls in FIG. 19 are common to those in FIG. 5, and different points will be mainly described below.

During the precharge cancel period T1, a switching signal line SH1L is controlled to be low and other switching signal lines (SH0L, SH0R) remain high. Thereby, the right-side local sense amplifier 20 is in a state where the left side NMOS transistor N30 is on and the right-side NMOS transistor N31 is off. Here, the switching signal line SH1L and the like are controlled to be the positive voltage VPA and the negative voltage VKK in the same manner as the word line WL. Meanwhile, during the precharge start period T7 after the completion of the read and write operations, the switching signal line SH1L returns to high, and the both sides two local bit lines LBL are precharged.

Figure 20:
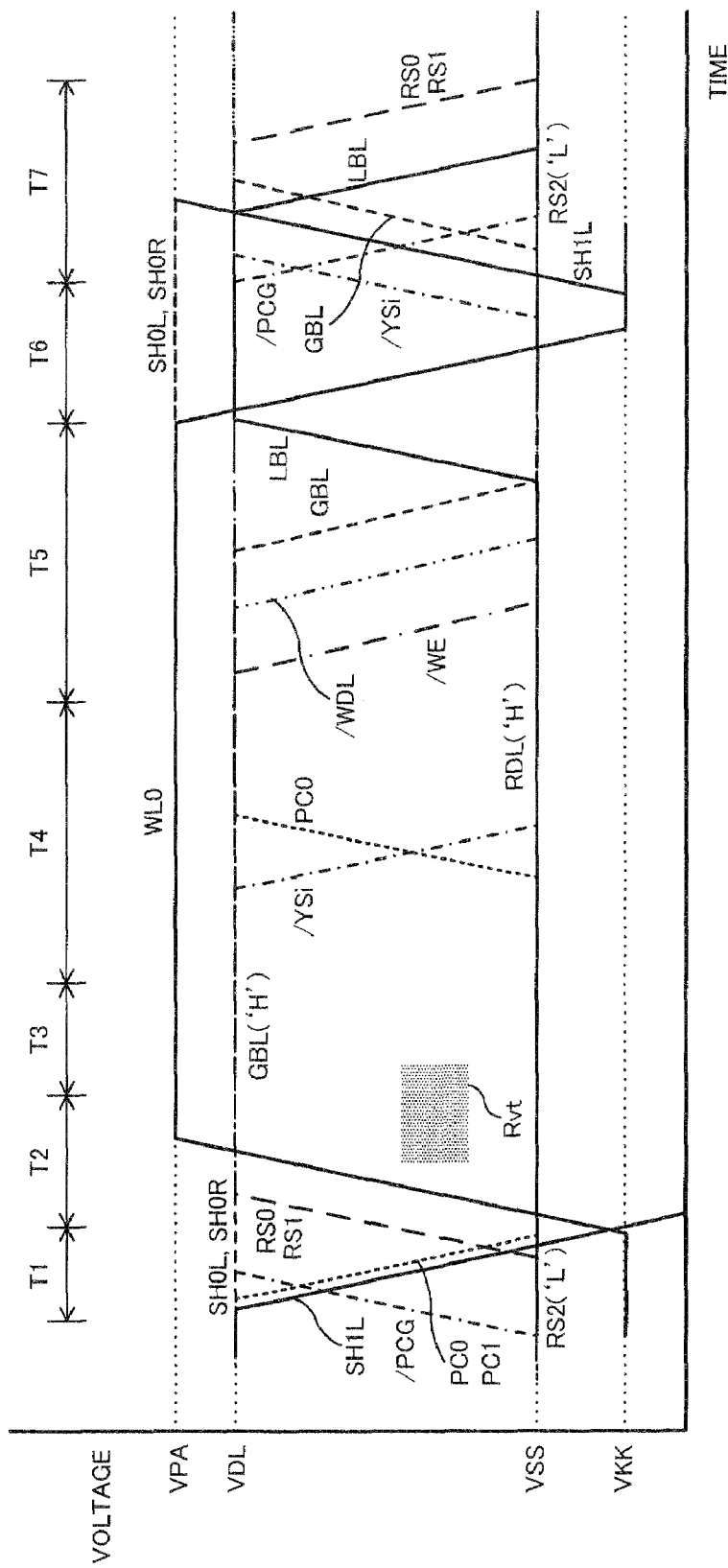
FIG. 20 is a diagram explaining read and write operations in the circuit configuration of FIG. 18 and showing waveforms in an operation of reading out a low level first and writing a high level.

FIG. 20 shows waveforms in the operation in which a low level is read out from the selected memory cell first and thereafter a high level is written to the selected memory cell, as in FIG. 6 of the first embodiment. Although basic control of FIG. 20 is almost common to that of FIG. 19, some signal waveforms such as the local bit line LBL, the global bit line GBL and the like are different. Differences between signal waveforms of FIGS. 20 and 19 are equal to the differences between signal waveforms of FIGS. 6 and 5, so description thereof is omitted.

By employing the above configuration of the fourth embodiment, the same function and effect as the first embodiment can be obtained, and additionally the number of local sense amplifiers 20 each of which is shared by the adjacent memory cell array 10 can be reduced. Thus, it is advantageous for reducing the layout area of the entire DRAM. Particularly, when the number of divisions of the memory cell arrays 10 in the bit line extending direction is increased, the employment of the fourth embodiment is sufficiently advantageous. This advantage is common to fifth to seventh embodiments described below.

Fifth Embodiment

Figure 21:
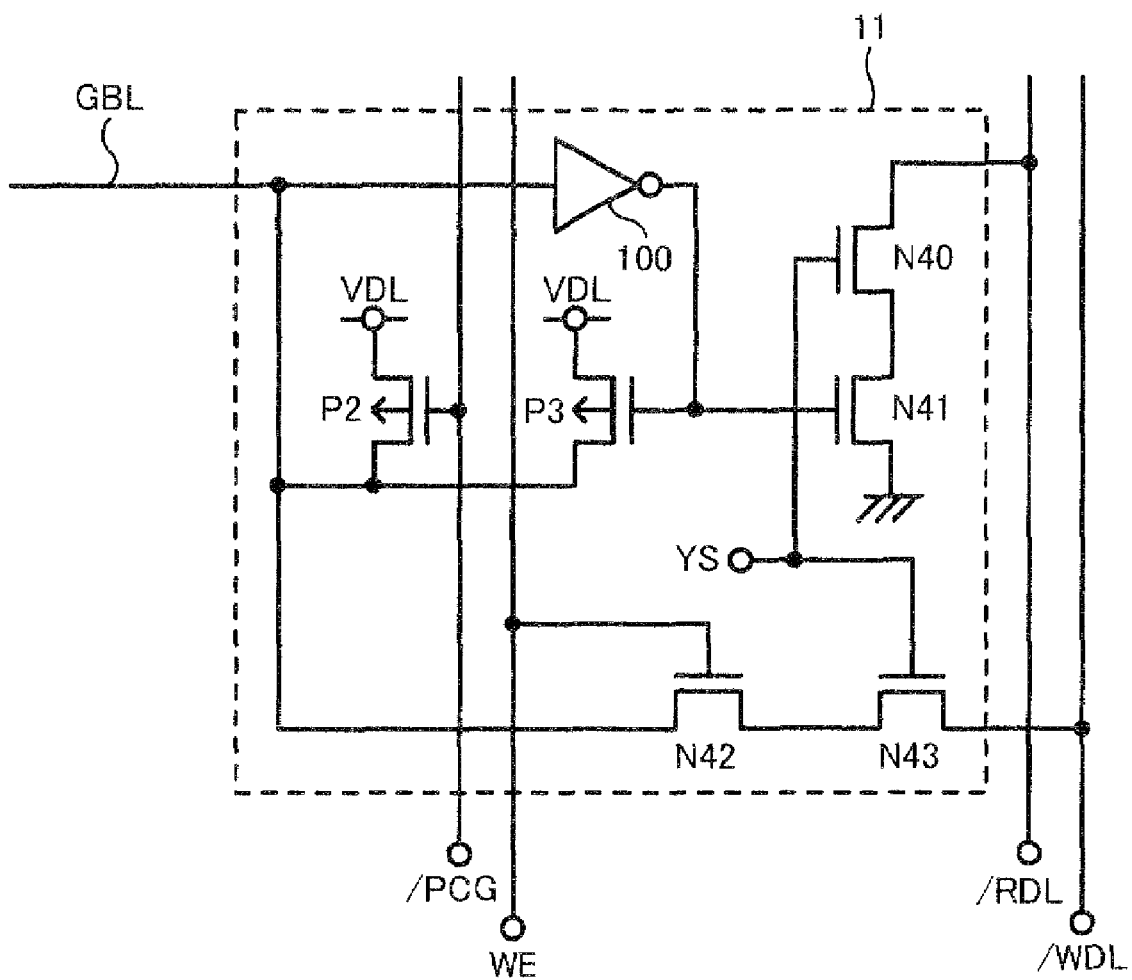
FIG. 21 is a diagram showing a configuration example of a global sense amplifier of the fifth embodiment.

A fifth embodiment of the present invention will be described. In the fifth embodiment, adjacent memory cell arrays 10 share the local sense amplifier 20 as in the fourth embodiment, however the configuration of the global sense amplifier 11 is different from that of the fourth embodiment. Beside, the configuration of the local sense amplifier 12 of the fifth embodiment is assumed to be the same as that of the fourth embodiment. FIG. 21 shows a configuration example of the global sense amplifier 11 of the fifth embodiment. The global sense amplifier 11 of FIG. 21 includes four NMOS transistor N40, N41, N42 and N43, two PMOS transistors P2 and P3 and one inverter 100.

In FIG. 21, a circuit portion including the PMOS transistors P2 and P3 and the inverter 100 is the same as in the fourth embodiment (FIG. 18). Meanwhile, a circuit portion including the four PMOS transistor P4 to P7 (FIG. 18) are replaced with the NMOS transistor N40 and 41 connected in series between the read data line /RDL of the negative logic and the ground potential VSS, and the NMOS transistor N42 and N43 connected in series between the global bit line GBL and the write data line /WDL of the negative logic. As shown in FIG. 21, in a read or write operation of a local sense amplifier 20 or 21 connected to the global bit line GBL, the select signal line YS of the positive logic is controlled to be high. In the read operation, data of the global bit line GBL is output to the read data line /RDL via the NMOS transistors N40 and N41. In the write operation, the control signal line WE of the positive logic is controlled to be high, and data input from the write data line /WDL is output to the global bit line GBL via the NMOS transistors N43 and N42.

Figure 22:
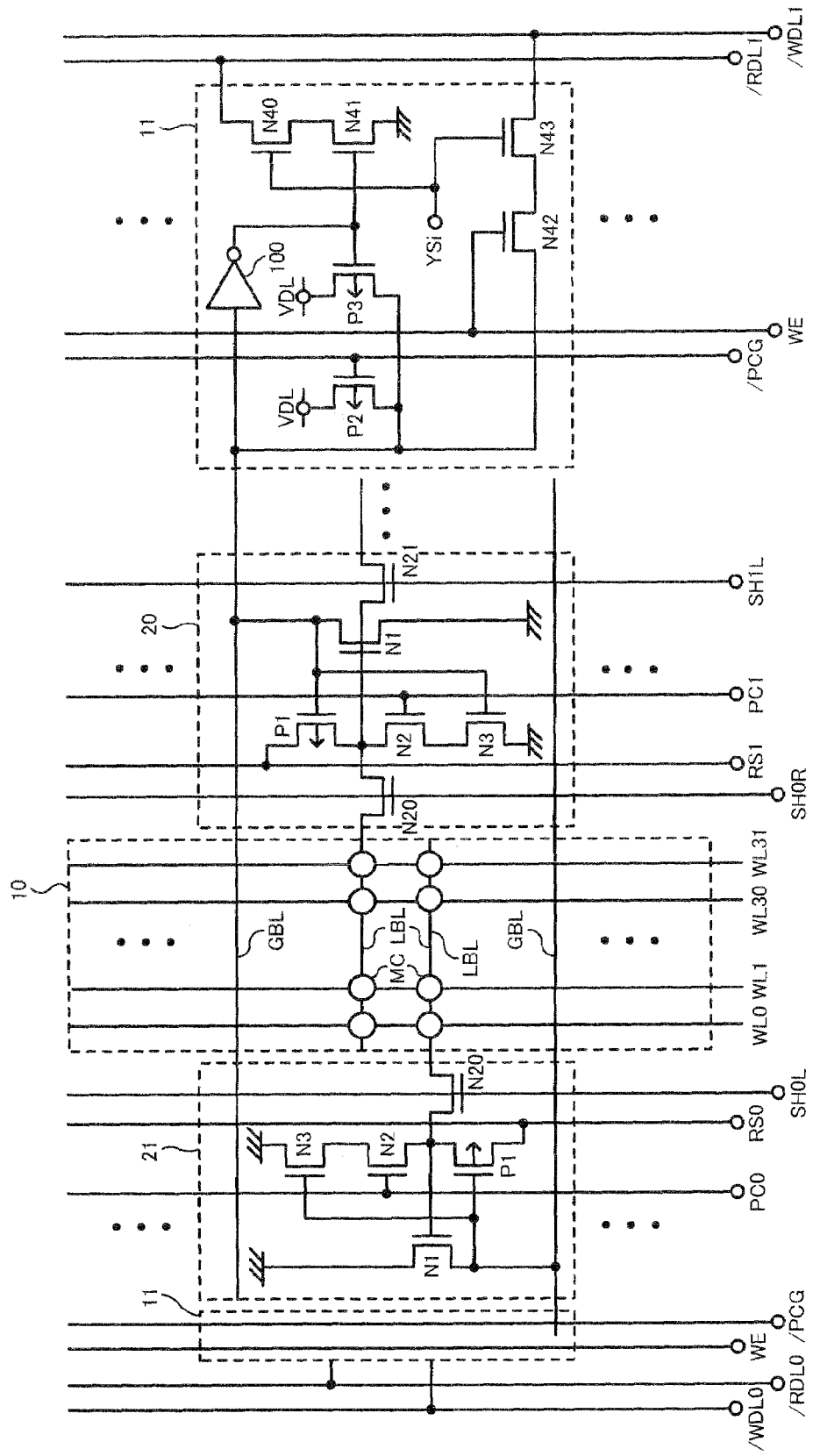
FIG. 22 is a diagram showing a configuration of a unit circuit of the fifth embodiment.

Next, circuit configuration and operation of the DRAM of the fifth embodiment will be described with reference to FIGS. 22 to 24. FIG. 22 shows a unit circuit as in FIG. 18 of the fourth embodiment. The configuration as shown in FIG. 22 is almost the same as those in FIG. 18 except the circuit configuration of the global sense amplifier 11 and some signal lines.

Figure 23:
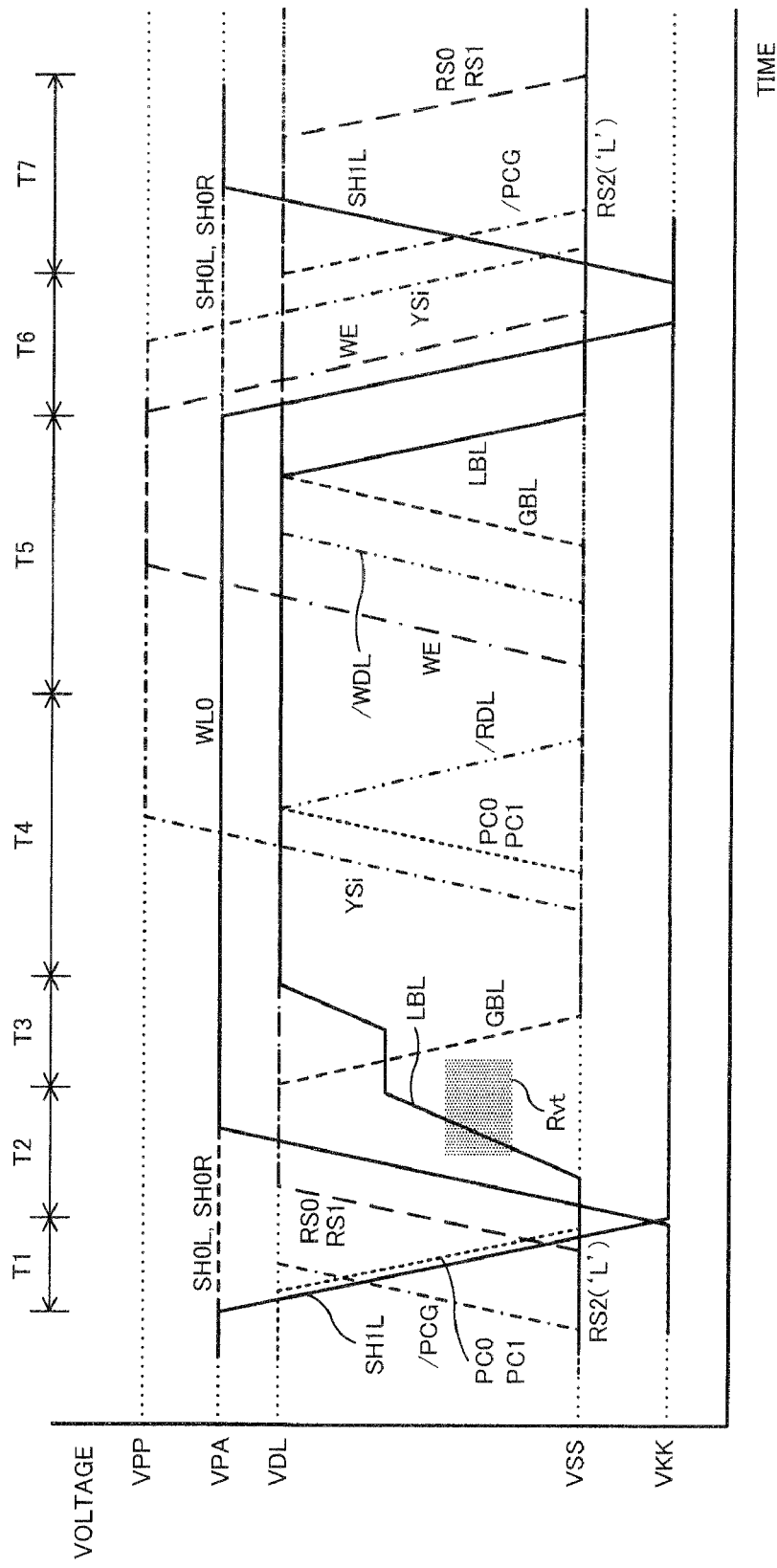
FIG. 23 is a diagram explaining read and write operations in the circuit configuration of FIG. 22 and showing waveforms in an operation of reading out a high level first and writing a low level.
Figure 24:
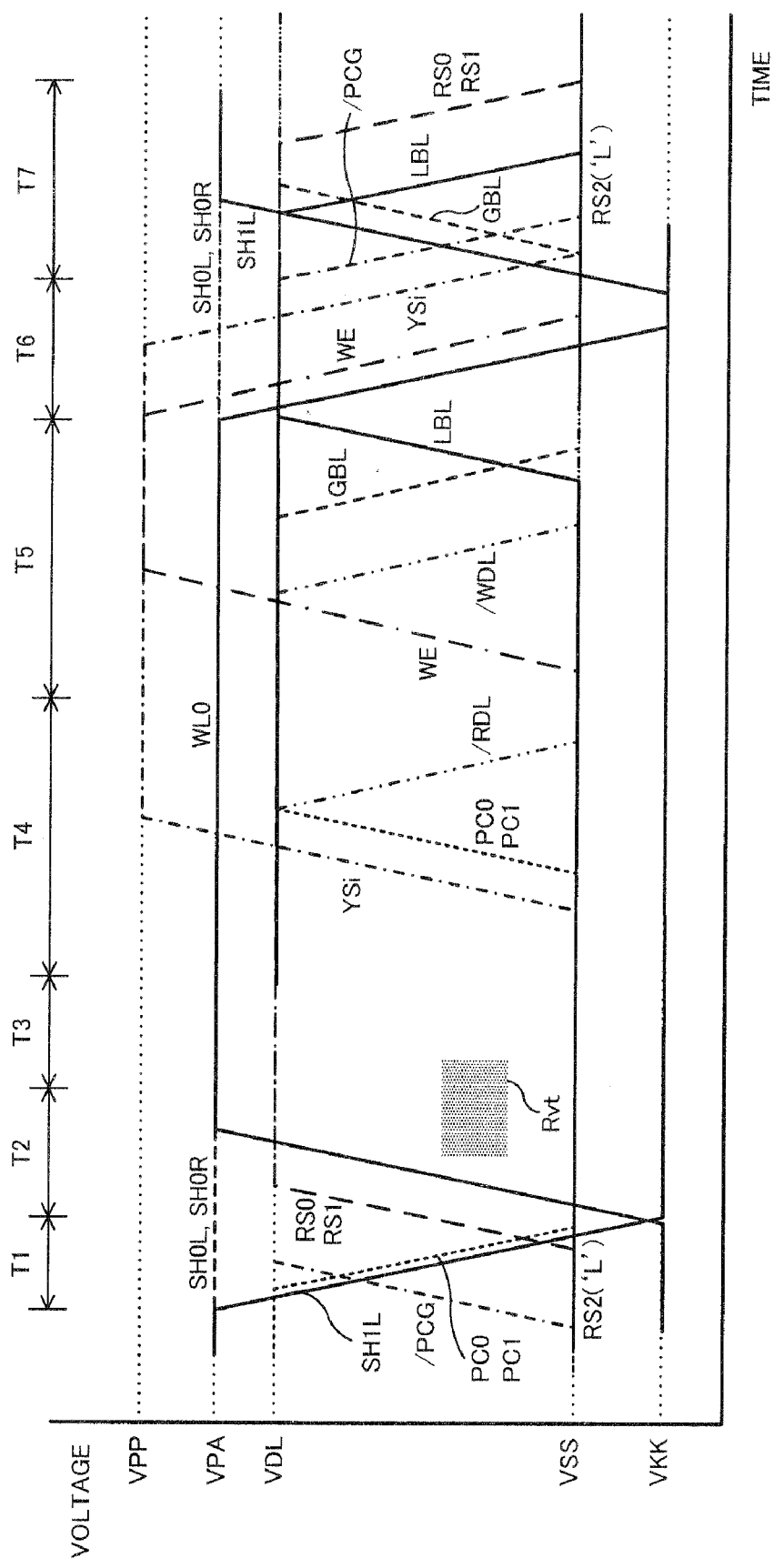
FIG. 24 is a diagram explaining read and write operations in the circuit configuration of FIG. 22 and showing waveforms in an operation of reading out a low level first and writing a high level.

FIGS. 23 and 24 show read and write operations in the circuit configuration of FIG. 22. Signal waveforms shown in FIGS. 23 and 24 are the same as those in FIGS. 19 and 20 of the fourth embodiment except that polarities of the select control line YSi, the control signal line WE and the read data line /RDL are inverted, so description thereof is omitted.

Sixth Embodiment

Figure 25:
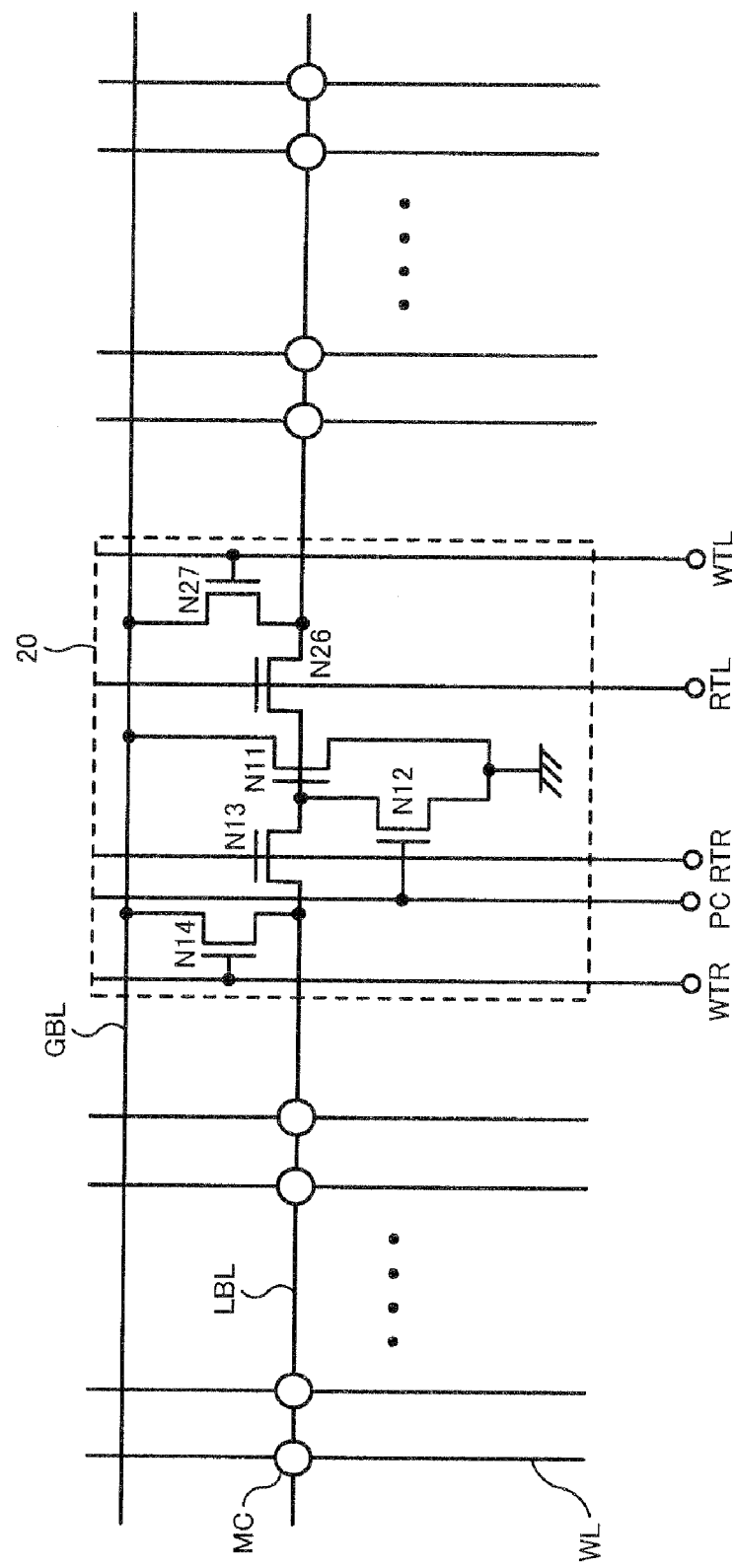
FIG. 25 is a diagram showing a configuration example of a shared local sense amplifier of a sixth embodiment.

A sixth embodiment of the present invention will be described. In a DRAM of the sixth embodiment, adjacent memory cell arrays 10 share the local sense amplifier 20 as in the fourth and fifth embodiments, however the configuration of the local sense amplifiers 20 and 21 is different from that of the fourth and fifth embodiments. FIG. 25 shows a configuration example of the shared local sense amplifier 20 of the sixth embodiment. In FIG. 25, there are shown two local bit lines LBL included in two adjacent memory cell arrays 10, and the local sense amplifier 20 arranged therebetween. The shared local sense amplifier 20 of FIG. 25 includes two NMOS transistors N26 and N28, in addition to the NMOS transistors N11, N12, N13 and N14 which are the same as in FIG. 7 of the second embodiment.

The four NMOS transistor N11 to N14, the precharge signal line PC and the control signal lines RTR and WTR have the same functions and operations as those in FIG. 7. Meanwhile, the NMOS transistor N26 is connected between the gate of the NMOS transistor N11 and the other local bit line LBL, and the gate of the NMOS transistor N26 is connected to the control signal line RTL. Further, the NMOS transistor N27 is connected between the global bit line GBL and the other local bit line LBL, and the gate of the NMOS transistor N27 is connected to the control signal line WTL.

By such a configuration, two local bit line LBL on both sides can be selectively connected to the gate of the NMOS transistor N11. In the read operation, the control signal lines RTR or RT1, of a selected one of both sides memory cell arrays 10 is controlled to be high, and the control signal lines RTR or RTL of a non-selected one thereof is controlled to be low. Similarly, in the write operation, the signal line WTR or WTL of a selected one of both sides memory cell arrays 10 is controlled to be high, and the control signal line WTR or WTL thereof is controlled to be low.

Figure 26:
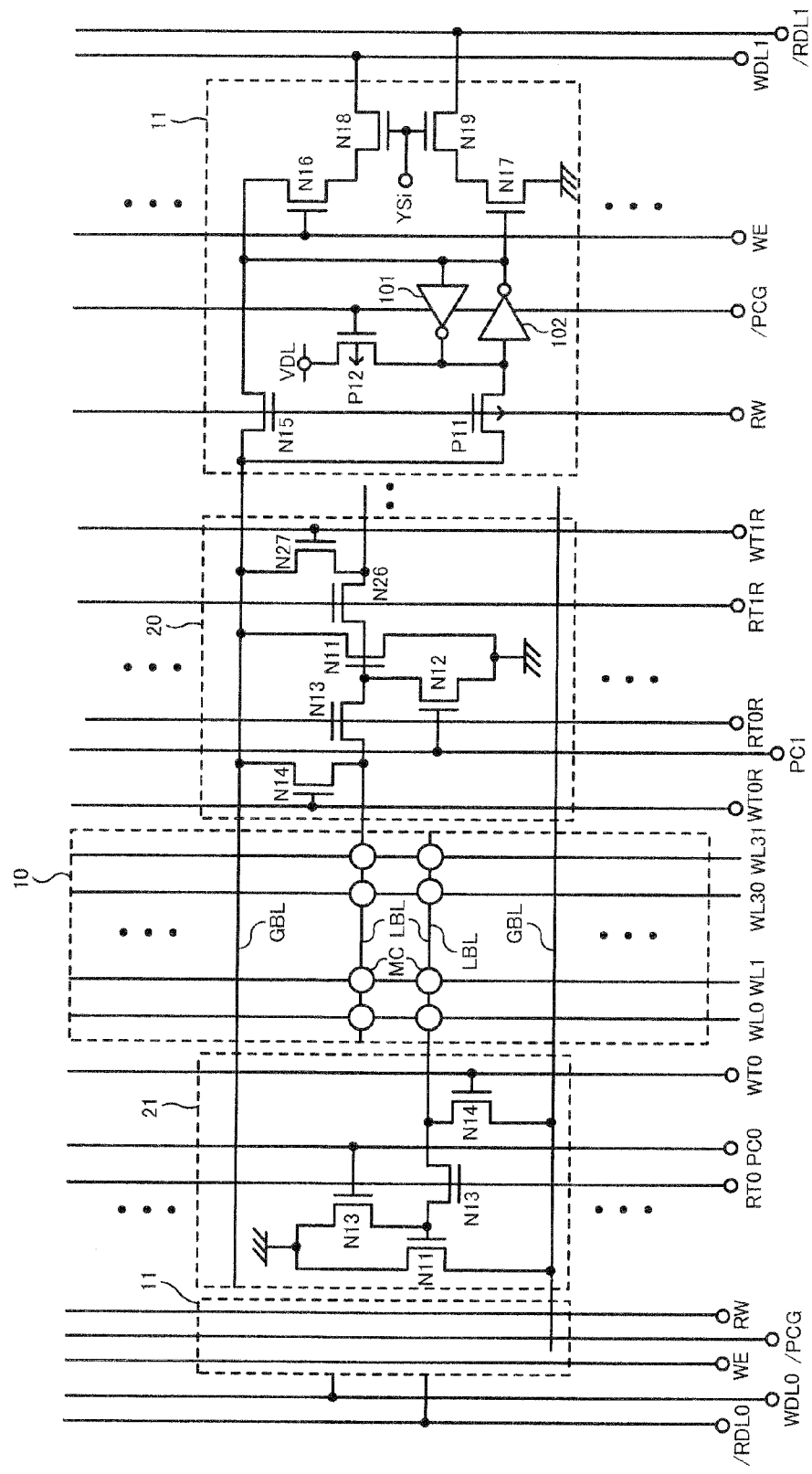
FIG. 26 is a diagram showing a configuration of a unit circuit of the sixth embodiment.
Figure 27:
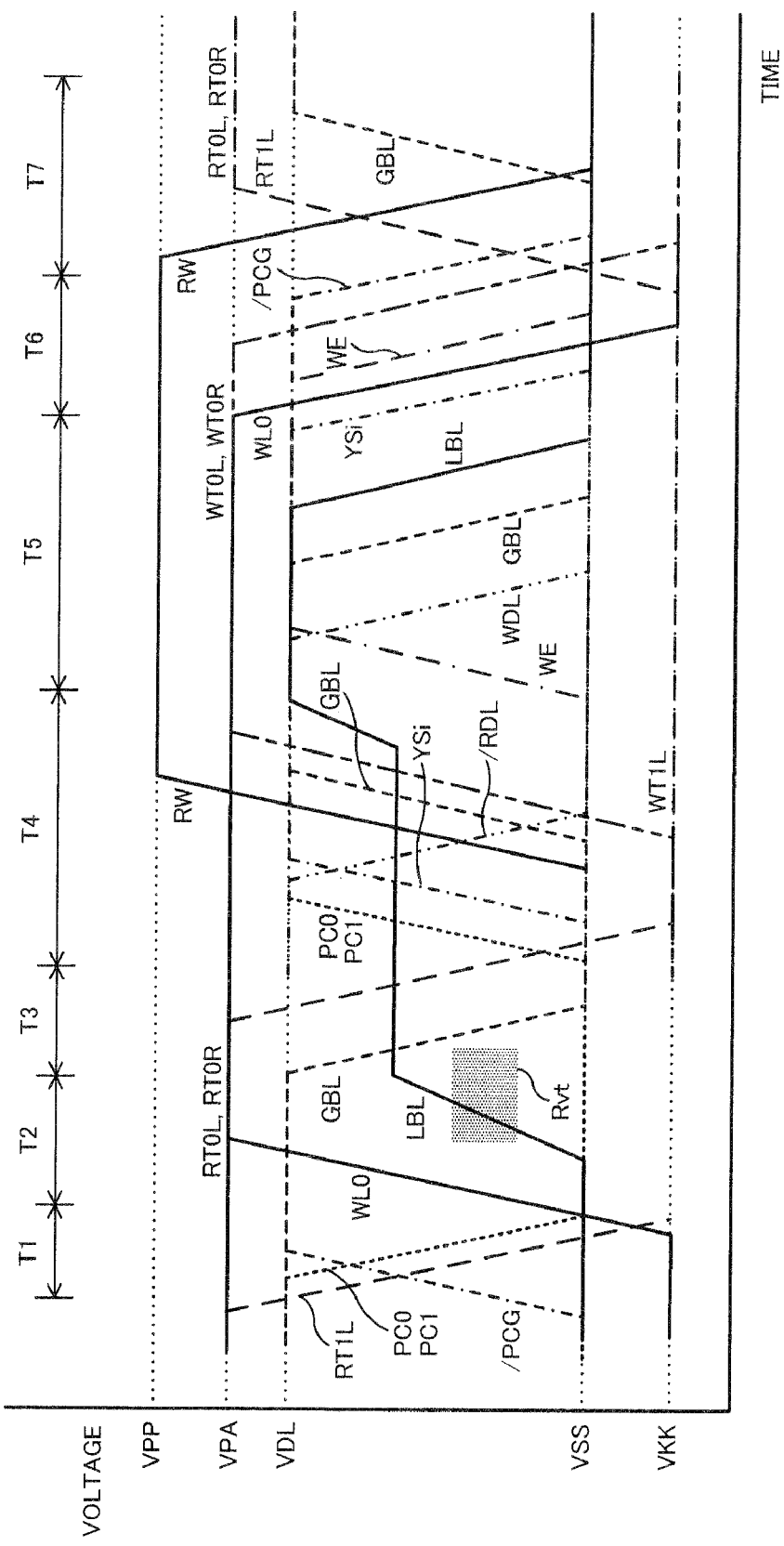
FIG. 27 is a diagram explaining read and write operations in the circuit configuration of FIG. 26 and showing waveforms in an operation of reading out a high level first and writing a low level.
Figure 28:
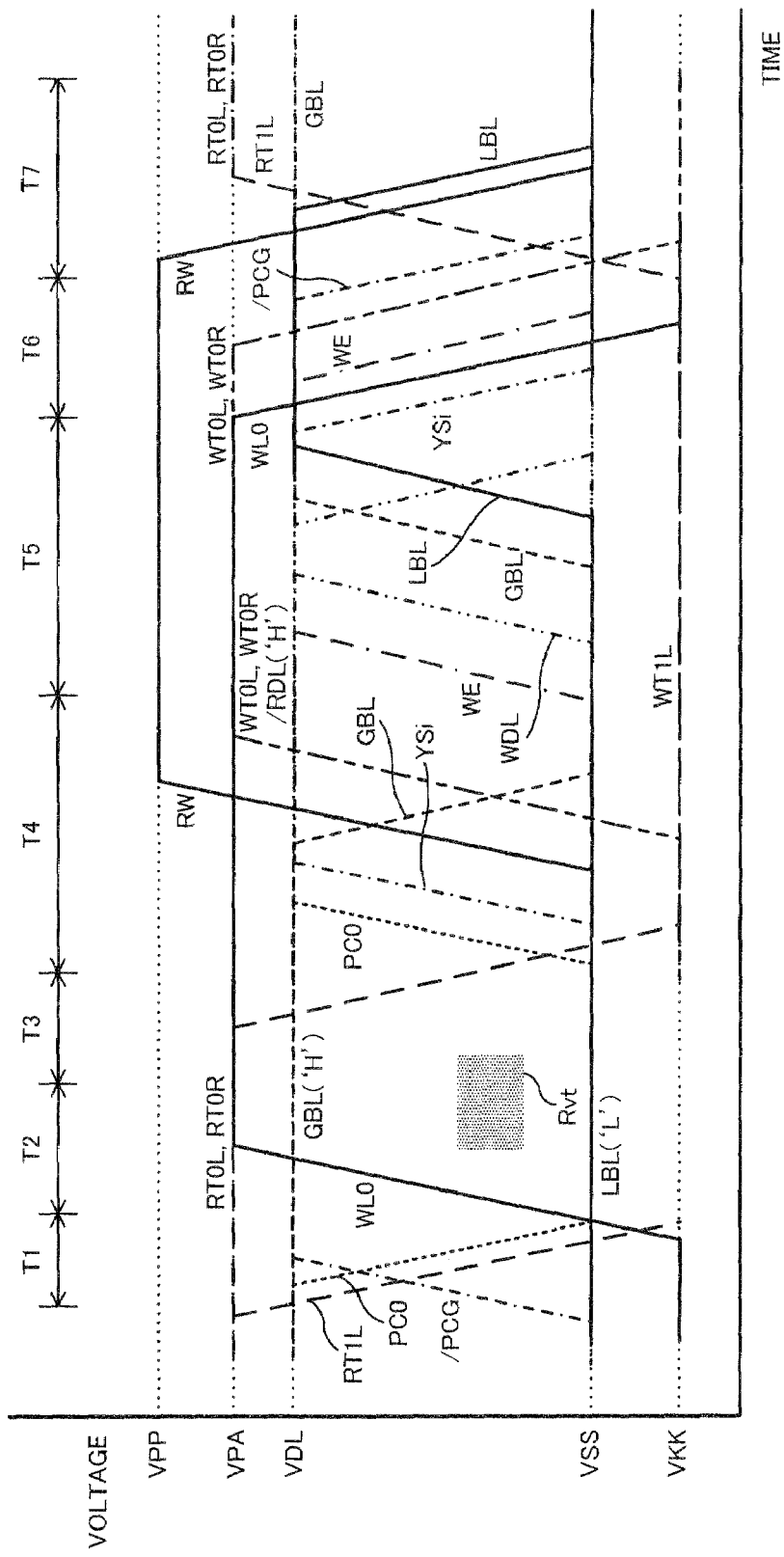
FIG. 28 is a diagram explaining read and write operations in the circuit configuration of FIG. 26 and showing waveforms in an operation of reading out a low level first and writing a high level.

Next, circuit configuration and operation of the DRAM of the sixth embodiment will be described with reference to FIGS. 26 to 28. FIG. 26 shows a unit circuit as in FIG. 9 of the second embodiment. Here, the global sense amplifier 11 of the sixth embodiment is assumed to have the same configuration as in the third embodiment (FIG. 8). The configuration as shown in FIG. 26 is almost the same as that in FIG. 9 except circuit configurations of the local sense amplifiers 20 and 21 and except arrangements of signal lines.

Read and write operations in the circuit configuration of FIG. 26 will be described with reference to FIGS. 27 and 28. Basic controls in FIGS. 27 and 28 are common to those in FIGS. 10 and 11 of the second embodiment, however the control signal lines RT0L, RT0R, RT1L, WT0L, WT0R, and WT1L are different. These different points are common to the switching controls of the fourth and fifth embodiments, so description thereof is omitted.

Seventh Embodiment

Figure 29:
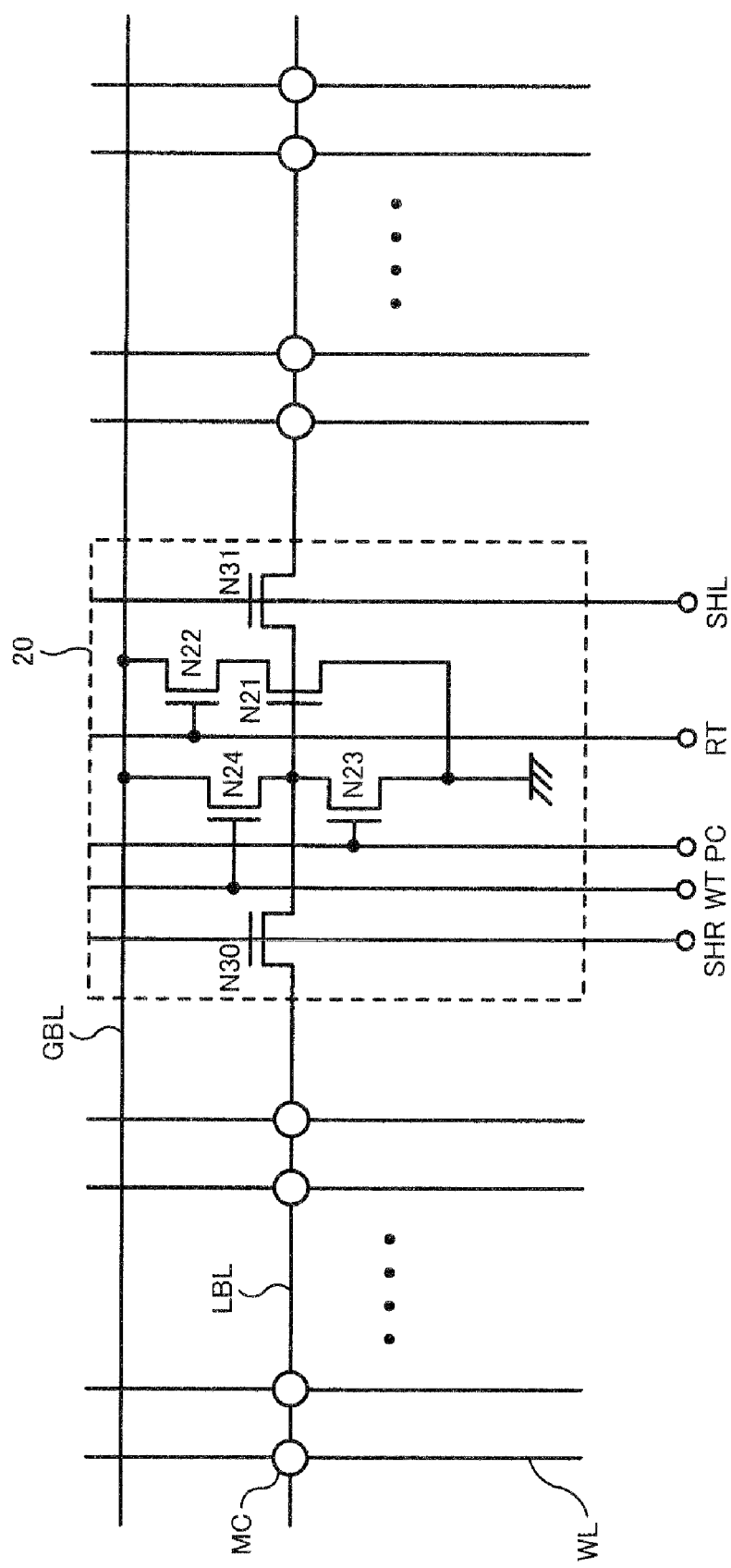
FIG. 29 is a diagram showing a configuration example of a shared local sense amplifier of a seventh embodiment.

A seventh embodiment of the present invention will be described. In a DRAM of the seventh embodiment, adjacent memory cell arrays 10 share the local sense amplifier 20 as in the fourth to sixth embodiments, however the configuration of the local sense amplifiers 20 and 21 is different from that of the fourth to sixth embodiments. FIG. 29 shows a configuration example of the shared local sense amplifier 20 of the seventh embodiment. In FIG. 29, there are shown two local bit lines LBL included in two adjacent memory cell arrays 10, and the local sense amplifier 20 arranged therebetween. The shared local sense amplifier 20 of FIG. 29 includes two NMOS transistors N30 and N31, in addition to the NMOS transistors N21, N22, N23 and N24 which are the same as in FIG. 12 of the third embodiment.

The four NMOS transistor N21 to N24, the precharge signal line PC and the control signal lines RT and WT have the same functions and operations as those in FIG. 12. Meanwhile, the NMOS transistor N30 is connected between the gate of the NMOS transistor N21 and one local bit line LBL, and the gate of the NMOS transistor N30 is connected to the switching signal line SHR. Further, the NMOS transistor N31 is connected between the gate of the NMOS transistor N21 and the other local bit line LBL, and the gate of the NMOS transistor N31 is connected the switching signal line SHL.

By such a configuration, two local bit lines LBL on both sides can be selectively connected to the gate of the NMOS transistor N21. In the read and write operations, the switching signal line SHR or SHL of a selected one of both sides memory cell arrays 10 is controlled to be high, and the switching signal line SHR or SHL of a non-selected one thereof is controlled to be low.

Figure 30:
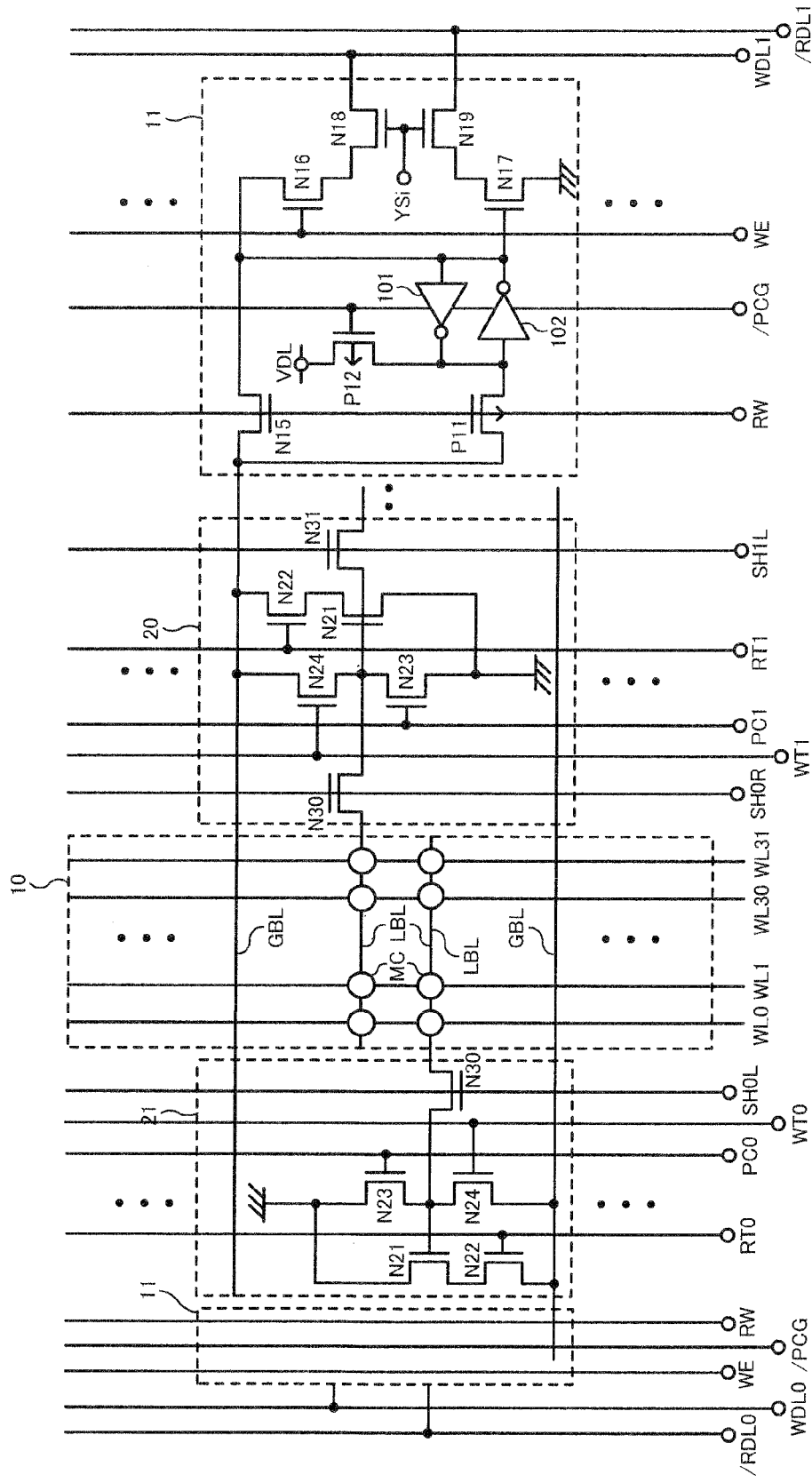
FIG. 30 is a diagram showing a configuration of a unit circuit of the seventh embodiment.
Figure 31:
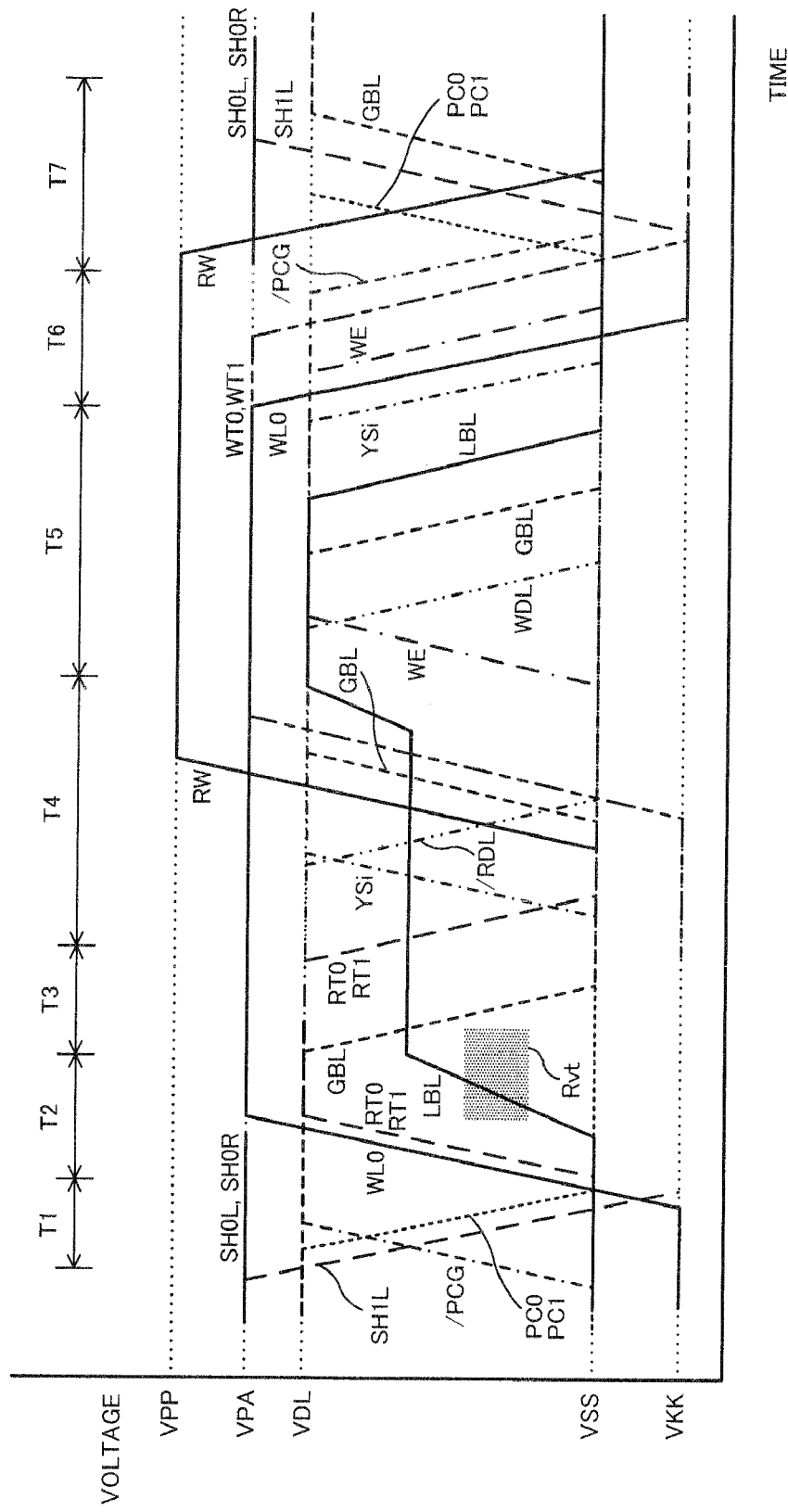
FIG. 31 is a diagram explaining read and write operations in the circuit configuration of FIG. 30 and showing waveforms in an operation of reading out a high level first and writing a low level.
Figure 32:
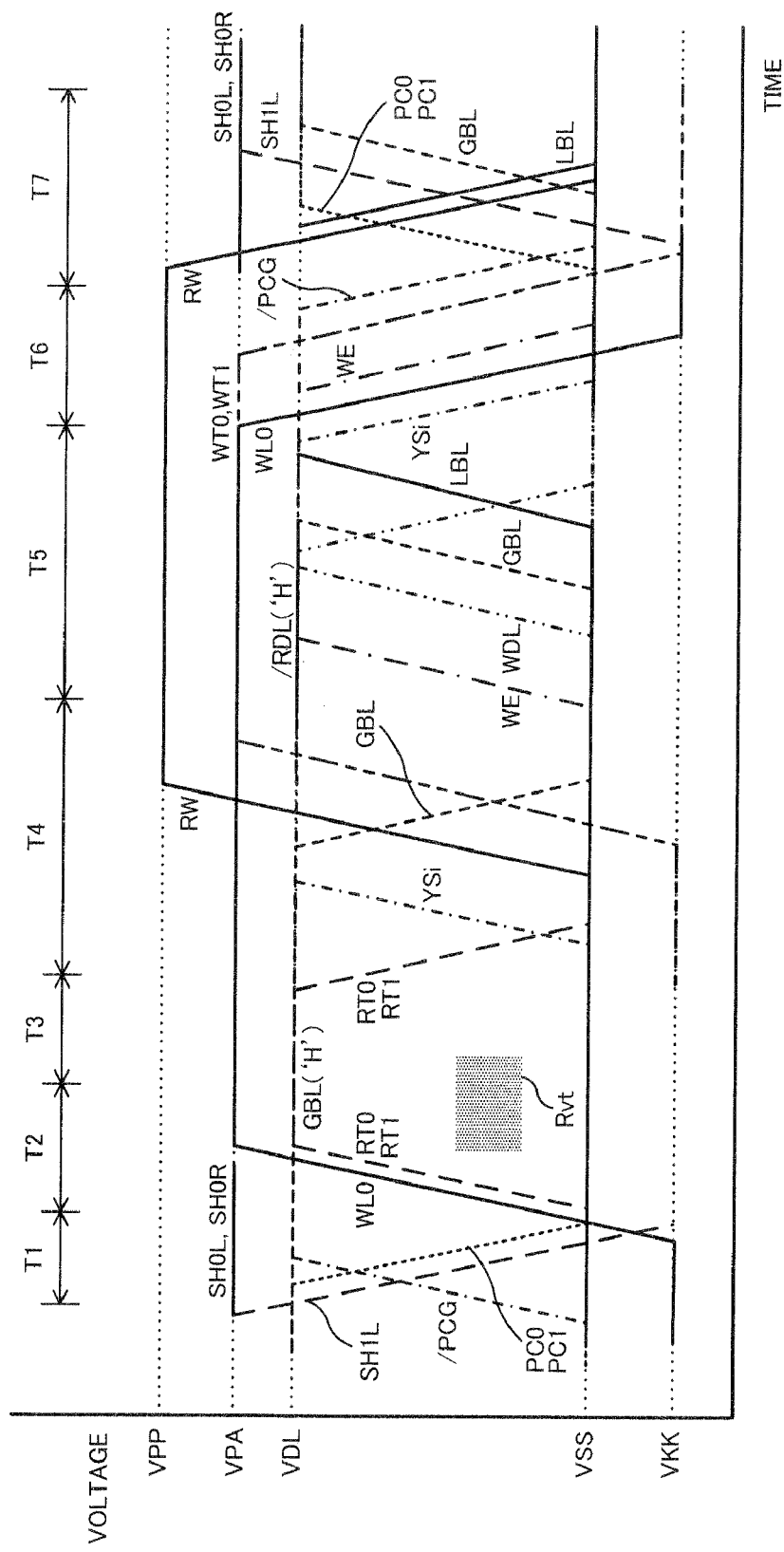
FIG. 32 is a diagram explaining read and write operations in the circuit configuration of FIG. 30 and showing waveforms in an operation of reading out a low level first and writing a high level.

Next, circuit configuration and operation of the DRAM of the seventh embodiment will be described with reference to FIGS. 30 to 32. FIG. 30 shows a unit circuit as in FIG. 13 of the third embodiment. Here, the global sense amplifier 11 of the seventh embodiment is assumed to have the same configuration as in the third embodiment (FIG. 8). The configuration as shown in FIG. 30 is almost the same as those in FIG. 13 except circuit configurations of the local sense amplifiers 20 and 21 and except arrangements of signal lines.

Read and write operations in the circuit configuration of FIG. 30 will be described with reference to FIGS. 31 and 32. Basic controls in FIGS. 31 and 32 are common to those in FIGS. 14 and 15 of the third embodiment, however the switching signal lines SH0L, SH0R and SH1L are different. These different points are common to the switching controls of the fourth to sixth embodiments, so description thereof is omitted.

As described above, the present invention has been specifically described based on the seven embodiments. However, the present invention is not limited to the above described embodiments, and can be variously modified without departing the essentials of the present invention. For example, an example has been shown in which the local bit lines LBL are partitioned into four sections in the bit line extending direction in the hierarchical memory cell array 10, however the number of sections in not limited to four and can be set freely.

Figure 33:
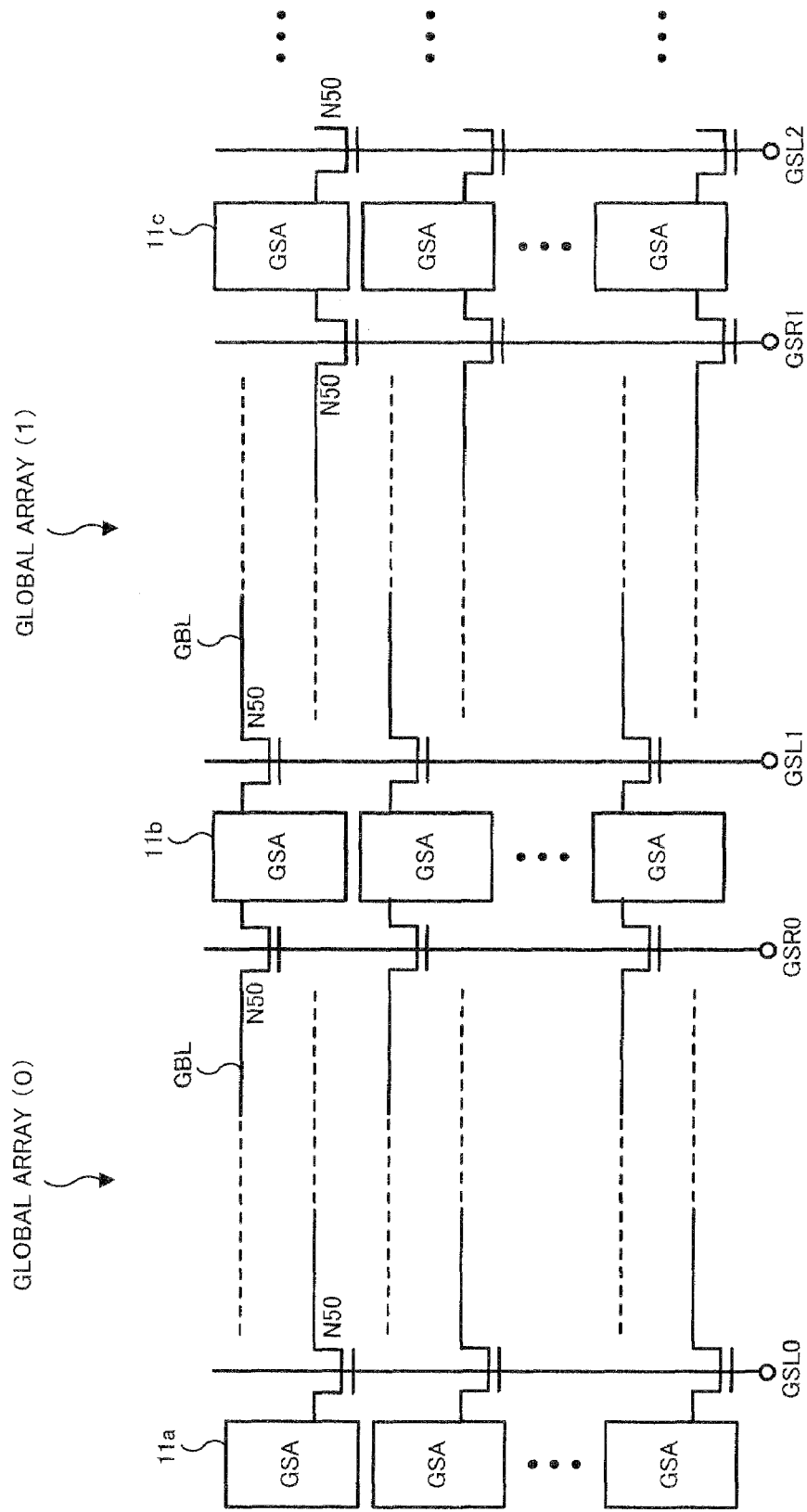
FIG. 33 is a diagram showing a configuration example of a global array having in which each global sense amplifier and each global bit line are divided in a DRAM.

Further, in the above embodiments, an example has been shown in which global bit lines GBL are arranged in the entire bit line extending direction of the DRAM, however an arrangement in which each global sense amplifier 11 and each global bit line GBL are divided may be employed. FIG. 33 shows a configuration example of a global array having such divisions in the DRAM. In FIG. 33, there are provided two global arrays, a plurality of global sense amplifiers 11a, 11b and 11c, a large number of NMOS transistors N50 for switching connections between the global bit lines GBL and the global sense amplifiers 11a, 11b and 11c. Gates of the NMOS transistors N50 are connected to the control signal lines GSL0, GSR0, GSL1, GSR1 and GSL2 in the order from the left. Although, an area including only two global arrays are shown in FIG. 33 for the simplicity, if the same configuration is repeatedly arranged in the bit line extending direction, the global arrays can be divided into the desired number of portions.

In the DRAM of FIG. 33, respective control signal lines are usually controlled to be high, and when selecting the global array, two control signal lines at opposite sides of two global sense amplifiers 11 on both sides of the global array are controlled to be low. For example, when the global array (1) is selected, the control signal lines GSR0 and GSL2 are controlled to be low, and two shared global sense amplifiers 11b and 11c are disconnected from two adjacent global arrays. Thereafter, when the read and write operations are completed and the selection of the global array is cancelled, the original state is returned. By employing the configuration of FIG. 33, a DRAM having larger storage capacity can be appropriately divided into areas, and the DRAM can be used more conveniently.

Figure 34A:
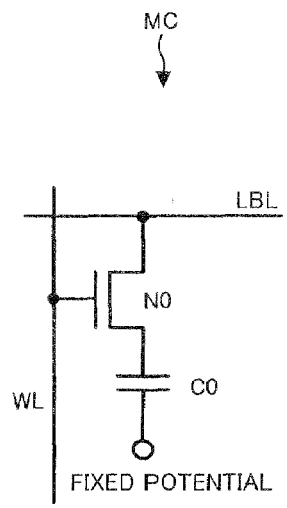
FIGS. 34A and 34B are diagrams showing two typical structures of a memory cell.
Figure 34B:
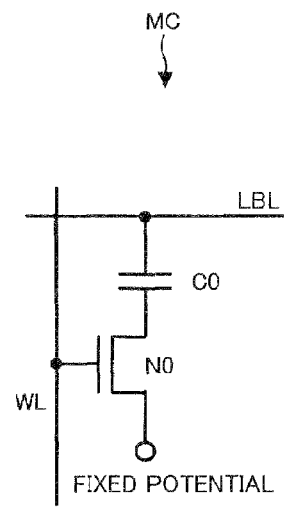

Moreover, various structures can be applied to the memory cell MC formed in the memory cell array 10 of the above embodiments. FIGS. 34A and 34B show two typical structures of the memory cell MC. Each of memory cells MC of FIGS. 34A and 34B includes an NMOS transistor N0 and a capacitor C0, and the word line WL is connected to the gate of the NMOS transistor N0. However, position relations between the memory cell MC and the local bit line LBL are different. That is, in FIG. 34A, the local bit line LBL is connected to one end of the NMOS transistor N0, and a common fixed potential is applied to one end of the capacitor C0. On the other hand, in FIG. 34B, the local bit line LBL is connected to one end of the capacitor C0, and the common fixed potential is applied to one end of the NMOS transistor N0. The above embodiments can be effectively applied to any of the memory cells MC in FIGS. 34A and 34B which is appropriately selected in accordance with structural characteristics of the DRAM.

The present invention is not limited to the above described embodiments, and various variations and modifications may be possible without departing from the scope of the present invention.

This application is based on the Japanese Patent application No. 2007-104348 filed on Apr. 11, 2007, entire content of which is expressly incorporated by reference herein.

What is claimed is:

1. A semiconductor memory device, comprising:
   a plurality of word lines;
   a plurality of global bit lines intersecting with said plurality of word lines;
   a plurality of local bit lines partitioned into N (N is an integer greater than or equal to two) sections along said global bit lines and aligned with a same pitch as said plurality of global bit lines; and
   N memory cell arrays each including a plurality of memory cells formed at intersections of said plurality of word lines and said plurality of local bit lines and being arranged corresponding to the sections of said local bit lines;
   a plurality of local sense amplifiers for amplifying a signal read out from a selected memory cell to said local bit line and for outputting the signal to said global bit line;
   a plurality of global sense amplifiers for amplifying the signal transmitted from said local sense amplifier corresponding to the selected memory cell through said global bit line and for selectively coupling the signal to an external data line.

2. The semiconductor memory device according to claim 1, wherein said local sense amplifiers are single-ended sense amplifiers arranged so that a pitch thereof in a word line extending direction is twice the pitch of said local bit lines.

3. The semiconductor memory device according to claim 2, wherein said local sense amplifiers are arranged on both sides of said memory cell array, and said local bit lines are alternately connected to said local sense amplifiers on one side and the other side of said memory cell array.

4. The semiconductor memory device according to claim 3, wherein two adjacent said memory cell arrays share said local sense amplifier.

5. The semiconductor memory device according to claim 4, wherein said local sense amplifier includes a switching circuit for switching connections to said local bit lines of said two adjacent memory cell arrays.

6. The semiconductor memory device according to claim 1, wherein said local sense amplifier includes an amplifying NMOS transistor which amplifies the signal read out to said local bit line and outputs the signal to said global bit line.

7. The semiconductor memory device according to claim 6, wherein said local sense amplifier includes a precharging NMOS transistor which is connected to a gate of said amplifying NMOS transistor at one end and has a gate to which a precharge signal is applied.

8. The semiconductor memory device according to claim 7, wherein said local sense amplifier includes an inverting circuit which inverts a signal of said global bit line after the signal read out to said local bit line is amplified so as to be rewritten to the memory cell.

9. The semiconductor memory device according to claim 8, wherein said inverting circuit includes a PMOS transistor connected between a drive control line and said local bit line, and an NMOS transistor connected between the other end of said precharging NMOS transistor and a ground potential.

10. The semiconductor memory device according to claim 7, wherein said local sense amplifier includes only NMOS transistors.

11. The semiconductor memory device according to claim 10, wherein said local sense amplifier includes an NMOS transistor which is connected between said local bit line and the gate of said amplifying NMOS transistor and has a gate to which a first control signal is applied, and includes an NMOS transistor which is connected between said global bit line and said local bit line and has a gate to which a second control signal is applied.

12. The semiconductor memory device according to claim 10, wherein said local sense amplifier includes an NMOS transistor which is connected between said global bit line and one end of said amplifying NMOS transistor and has a gate to which a first control signal is applied, and includes an NMOS transistor which is connected between said global bit line and said local bit line and has a gate to which a second control signal is applied.

13. The semiconductor memory device according to claim 1, wherein said global sense amplifiers are single-ended sense amplifiers arranged so that a pitch thereof in a word line extending direction is twice the pitch of said global bit lines and said local bit lines.

14. The semiconductor memory device according to claim 13, wherein said global sense amplifiers are arranged at both ends of said N memory cell arrays, and said global bit lines are alternately connected to said global sense amplifiers at one end and the other end of said memory cell arrays.

15. The semiconductor memory device according to claim 13, wherein a plurality of global arrays each including said plurality of global bit lines are arranged, and two of said plurality of global arrays adjacent to each other in an extending direction of said global bit lines share said global sense amplifier.

16. The semiconductor memory device according to claim 15, wherein a switching circuit for switching connections between said global arrays and said global sense amplifiers is provided.

17. The semiconductor memory device according to claim 13, wherein each of said global sense amplifiers selectively outputs read data of the memory cell, which is transmitted through said global bit line, to a read data line.

18. The semiconductor memory device according to claim 13, wherein each of said global sense amplifiers selectively outputs data input from a write data line to said global bit line as write data for the memory cell.

* * * * *